(12) United States Patent
Kawabe et al.

(10) Patent No.: US 7,704,548 B2
(45) Date of Patent: Apr. 27, 2010

(54) METHOD FOR MANUFACTURING WIRING BOARD

(75) Inventors: Tadahiko Kawabe, Kanishi Gifu (JP); Masao Kuroda, Inuyama (JP); Yasuhiro Sugimoto, Konan (JP); Hajime Saiki, Konan (JP); Shinji Yuri, Kasugai (JP); Makoto Origuchi, Komaki (JP)

(73) Assignee: NGK Spark Plug Co., Ltd., Aichi-Ken (JP)

( * ) Notice: Subject to any disclaimer, the term of this patent is extended or adjusted under 35 U.S.C. 154(b) by 588 days.

(21) Appl. No.: 11/739,798

(22) Filed: Apr. 25, 2007

(65) Prior Publication Data

US 2007/0281394 A1 Dec. 6, 2007

(30) Foreign Application Priority Data

Apr. 25, 2006 (JP) .............................. 2006-120223

(51) Int. Cl.
*B05D 5/12* (2006.01)
*H01B 13/00* (2006.01)

(52) U.S. Cl. .................... 427/96.1; 427/96.9; 427/97.2; 216/6; 216/13; 216/17; 216/18; 174/250; 174/260; 29/846

(58) Field of Classification Search ................ 427/96.1, 427/96.9, 97.2; 216/6, 13, 17, 18; 29/846; 174/250, 260

See application file for complete search history.

(56) References Cited

U.S. PATENT DOCUMENTS 6,074,567 A * 6/2000 Kuraishi et al. ............... 216/18

| 7,002,075 B2 | 2/2006 | Kambe et al. ............... 174/52.1 |
| 2005/0024813 A1* | 2/2005 | Shimizu et al. ............. 361/328 |
| 2006/0085043 A1* | 4/2006 | Stevenson ..................... 607/36 |
| 2007/0240303 A1* | 10/2007 | Kim et al. ...................... 29/825 |

FOREIGN PATENT DOCUMENTS

| JP | 2002 223076 | 8/2002 |
| JP | 2005 039243 | 2/2005 |

* cited by examiner

*Primary Examiner*—Shamim Ahmed
(74) *Attorney, Agent, or Firm*—Kusner & Jaffe

(57) ABSTRACT

A method for manufacturing a wiring board which can simplify a manufacturing step. In a preparation step, a core board and an electronic component are prepared. In an insulating layer formation and fixing step, after accommodating the electronic component in an accommodation hole, a lowermost resin insulating layer is formed, and a gap between the electronic component and the core board is filled with a part of the lowermost resin insulating layer so as to fix the electronic component to the core board. In an opening portion formation step, a portion of the lowermost resin insulating layer located directly above the gap between the electronic component and the core board is removed so as to form an opening portion exposing a part of a core board main surface side conductor and a component main surface side electrode. In a main surface side connecting conductor formation step, a main surface side connecting conductor is formed in the opening portion so as to connect the core board main surface side conductor to the component main surface side electrode.

12 Claims, 13 Drawing Sheets

METHOD FOR MANUFACTURING WIRING BOARD

FIELD OF THE INVENTION

The present invention relates to a wiring board having a structure in which an electronic component is embedded in a core board and a wiring laminated body is formed on a surface of the core board.

BACKGROUND OF THE INVENTION

In recent years, the semiconductor integrated circuit elements (IC chips) used for a CPU in a computer or the like operate at higher speeds, and with higher level functional features, than previously. Along with this advance, the number of terminals has increased and the terminal interval has tended to be smaller and narrower. Generally speaking, terminals in large numbers are densely packed on the bottom surface of the IC chip in an array, and a terminal block so formed is connected to a terminal block at the motherboard side by a "flip chip" connection. However, because there is a large difference in pitch between the terminal block at the IC chip side and the terminal block at the motherboard side, it is difficult to directly connect the IC chip to the motherboard. Therefore, the connection method generally employed is one wherein a package constituted by the IC chip, which is mounted on a wiring board for mounting the IC chip, is produced and then mounted on the motherboard. Examples of such wiring boards which constitute this type of package include a wiring board wherein a capacitor is embedded in a core substrate so as to attain a reduction in switching noise of an IC chip and a stabilization of power supply voltage. Since a length of the wiring connecting an IC chip and a capacitor becomes long, the above effect cannot be obtained due to an increase in inductance component of the wiring whereby the capacitor is preferably disposed near the IC chip. There has been suggested, as an example, a circuit board in which a capacitor is embedded in a core disposed directly under an IC chip. For example, see Japanese Patent Application Laid-Open (kokai) No. 2005-39243 (refer to FIG. 4, etc.).

When a power supply voltage supplied to an IC chip is not sufficient, it will cause a malfunction of the IC chip. Thus, there has been a demand for supplying as much electrical power to the IC chip as possible. A conventional wiring board provides a plurality of power supply pathways used for supplying the electrical power to the IC chip. Such a power supply pathway includes a first power supply pathway connected to the IC chip through a through-hole conductor which penetrates a core board in a thickness direction and a second power supply pathway connected to the IC chip through a via conductor which is provided in a capacitor.

For example, the conventional wiring board for mounting an IC chip is manufactured in the following procedures. First, a core board made of polymer material and including an accommodation hole which opens at both of a core main surface and a core rear surface is prepared. In addition, an embedding capacitor which includes a plurality of electrodes on a capacitor main surface and a capacitor rear surface, respectively, is prepared. Next, an opening portion at the core board rear surface side of the accommodation hole is sealed by an adhesive tape or the like, and, in this state, the embedding capacitor is accommodated in the accommodation hole and temporarily fixed therein. In a subsequent fixing step, a resin filler is filled in a gap between an inner face of the accommodation hole and a side face of the capacitor and hardened to fix the capacitor to the core board. Then, resin insulating resin insulating layers made of polymer material as a main component and conductor layers are formed on a top surface and a rear surface of a compound base material composed of the core board and the capacitor. As a result, a predetermined wiring board is produced. It is noted that a wiring board having the plurality of capacitors, which are disposed in the accommodation holes in the lateral direction, in which a part of the electrodes in the capacitor and the conductor patterns on the core main surface are connected through connecting conductors, has been disclosed. However, there is a problem that a connecting conductor is only connectable to an electrode disposed on an outer circumference portion of the capacitor.

SUMMARY OF THE INVENTION (1) A method for manufacturing a wiring board, comprising: a preparation step of preparing a core board including a core main surface, a core rear surface, an accommodation hole opening at least at the core main surface side and a core board main surface side conductor disposed on the core main surface, and preparing a via array type capacitor including a capacitor main surface, a capacitor rear surface, a plurality of via conductors whose one end is located at the capacitor main surface, a plurality of inner electrode layers connected to the plurality of via conductors and laminated with a dielectric layer interposed therebetween and a capacitor main surface side electrode disposed on the capacitor main surface and connected to an end of plural via conductors; an insulating layer formation and fixing step of forming a lowermost resin insulating layer, which serves as a lowermost layer of a wiring laminated body, on the core main surface and the capacitor main surface after accommodating the capacitor in the accommodation hole and fixing the capacitor to the core board by filling a gap between the capacitor and the core board with a portion of the lowermost resin insulating layer; an opening portion formation step of forming an opening portion exposing a part of the core board main surface side conductor and the capacitor main surface side electrode by removing at least a portion of the lowermost resin insulating layer located directly above the gap; and a main surface side connecting conductor formation step of forming a main surface side connecting conductor in the opening portion and connecting the core board main surface side conductor to the capacitor main surface side electrode.

(2) A method for manufacturing a wiring board, comprising: a preparation step of preparing a core board including a core main surface, a core rear surface, an accommodation hole opening at least at the core main surface side and a core board main surface side conductor disposed on the core main surface, and a capacitor including a capacitor main surface, a capacitor rear surface and a capacitor main surface side electrode disposed on the capacitor main surface; an insulating layer formation and fixing step of forming a lowermost resin insulating layer, which serves as a lowermost layer of a wiring laminated body, on the core main surface and the capacitor main surface after accommodating the capacitor in the accommodation hole and fixing the capacitor to the core board by filling a gap between the capacitor and the core board with a portion of the lowermost resin insulating layer; an opening portion formation step of forming an opening portion exposing a part of the core board main surface side conductor and the capacitor main surface side electrode by removing at least a portion of the lowermost resin insulating layer located directly above the gap; and a main surface side connecting conductor formation step of forming a main surface side connecting conductor in the opening portion and connecting the core board main surface side conductor to the capacitor main surface side electrode.

(3) A method for manufacturing a wiring board, comprising: a preparation step of preparing a core board including a core main surface, a core rear surface, an accommodation hole opening at both of the core main surface side and the core rear surface, a core board main surface side conductor disposed on the core main surface and a core board rear surface side conductor disposed on the core rear surface, and preparing an electronic component including a component main surface, a component rear surface, a component main surface side electrode disposed on the component main surface and a component rear surface side electrode disposed on the component rear surface; an insulating layer formation and fixing step of forming a lowermost resin insulating layer, which serves as a lowermost layer of a first wiring laminated body, on the core main surface and the component main surface after accommodating the electronic component in the accommodation hole and fixing the electronic component to the core board by filling a gap between the electronic component and the core board with a portion of the lowermost resin insulating layer; an insulating layer formation step of forming an uppermost resin insulating layer, which serves as an uppermost layer of a second wiring laminated body, on the core rear surface and the component rear surface after the insulating layer formation and fixing step; an opening portion formation step of forming a main surface side opening portion exposing a part of the core board main surface conductor and the component main surface side electrode by removing at least a portion of the lowermost resin insulating layer located directly above the gap, and for forming a rear surface side opening portion exposing a part of the core board rear surface conductor and the component rear surface side electrode by removing at least a portion of the uppermost resin insulating layer located directly under the gap so as to; and a main surface side connecting conductor formation step of forming a main surface side connecting conductor in the main surface side opening portion and connecting the core board main surface side conductor to the component main surface side electrode, and forming a rear surface side connecting conductor in the rear surface side opening portion and connecting the core board rear surface side conductor to the component rear surface side electrode.

(4) A method for manufacturing a wiring board, comprising: a preparation step of preparing a core board including a core main surface, a core rear surface, an accommodation hole opening at both of the core main surface side and the core rear surface, a core board main surface side conductor disposed on the core main surface and a core board rear surface side conductor disposed on the core rear surface, and a capacitor including a capacitor main surface, a capacitor rear surface, a plurality of via conductors whose one end is located at the capacitor main surface, a plurality of inner electrode layers connected to the plurality of via conductors and laminated with a dielectric layer interposed therebetween, a capacitor main surface side electrode disposed on the capacitor main surface and a capacitor rear surface side electrode disposed on the capacitor rear surface; an insulating layer formation and fixing step of forming a lowermost resin insulating layer, which serves as a lowermost layer of a first wiring laminated body, on the core main surface and the capacitor main surface after accommodating the capacitor in the accommodation hole and fixing the capacitor to the core board by filling a gap between the capacitor and the core board with a portion of the lowermost resin insulating layer; an insulating layer formation step of forming an uppermost resin insulating layer, which serves as an uppermost layer of a second wiring laminated body, on the core rear surface and the capacitor rear surface after the insulating layer formation and fixing step; an opening portion formation step of forming a main surface side opening portion exposing a part of the core board main surface conductor and the component main surface side electrode by removing at least a portion of the lowermost resin insulating layer located directly above the gap, and for forming a rear surface side opening portion exposing a part of the core board rear surface conductor and the capacitor rear surface side electrode by removing at least a portion of the uppermost resin insulating layer located directly under the gap; a main surface side connecting conductor formation step of forming a main surface side connecting conductor in the main surface side opening portion and connecting the core board main surface side conductor to the capacitor main surface side electrode; and a rear surface side connecting conductor formation step of forming a rear surface side connecting conductor in the rear surface side opening portion and connecting the core board rear surface side conductor to the capacitor rear surface side electrode, wherein the via conductor includes a plurality of power supplying via conductors and a plurality of grounding via conductors, wherein the plurality of inner electrode layers includes a plurality of first inner electrode layers connected to the plurality of power supplying via conductors and a plurality of second inner electrode layers connected to the plurality of grounding via conductors, wherein the capacitor main surface side electrode includes a first capacitor main surface side electrode disposed on the capacitor main surface and connected to an end portion of the plurality of power supplying via conductors and a second capacitor main surface side electrode disposed on the capacitor main surface and connected to an end portion of the plurality of grounding via conductors, wherein the capacitor rear surface side electrode includes a first capacitor rear surface side electrode disposed on the capacitor rear surface and connected to an end portion of the plurality of power supplying via conductors and a second capacitor rear surface side electrode disposed on the capacitor rear surface and connected to an end portion of the plurality of grounding via conductors, wherein the main surface side connecting conductor connects a core board main surface side power supplying pattern serving as the core board main surface side conductor to the first capacitor main surface side electrode in the main surface side connecting conductor formation step, and wherein the rear surface side connecting conductor connects a core board rear surface side grounding pattern serving as the core board rear surface side conductor to the second capacitor rear surface side electrode in the rear surface side connecting conductor formation step.

DESCRIPTION OF REFERENCE NUMERALS

Figure 1:
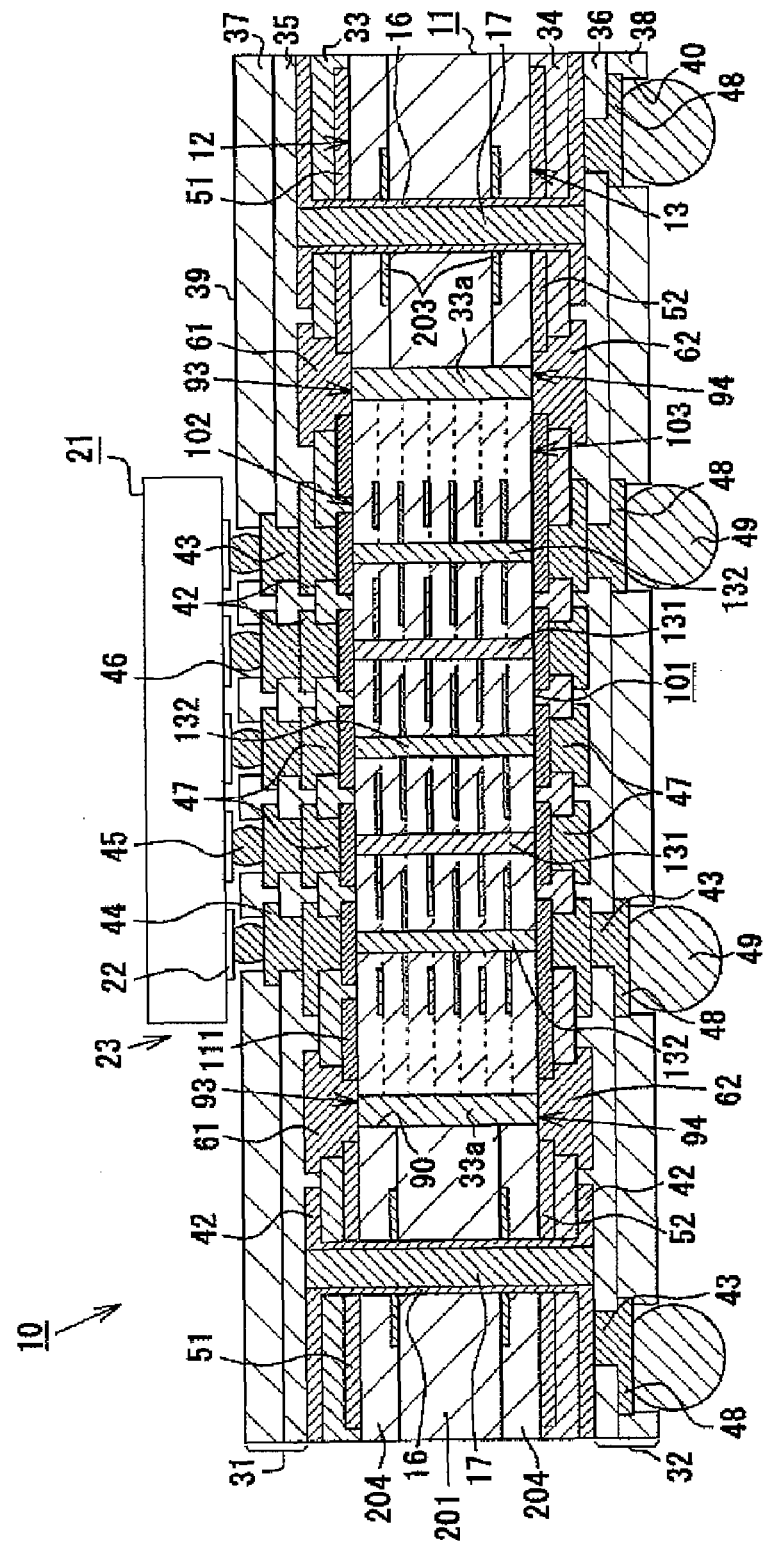
FIG. 1 is a schematic sectional view showing a wiring board according to a first embodiment for carrying out the present invention.

10, 10A, 10B, 10C, 10D, 10E: wiring board
11: core board
12: core main surface
13: core rear surface
16: through-hole conductor
31: first buildup layer which constitutes a wiring laminated body
33: lowermost resin insulating layer which constitutes a wiring laminated body
42: conductor layer which constitutes a wiring laminated body
51: core board main surface side power supplying pattern serving as a core board main surface side conductor
61: obverse surface side connecting pattern serving as a main surface side connecting conductor
63: concave portion
90: accommodation hole
92: resin filler
101: ceramic capacitor serving as an electronic component and a capacitor
102: capacitor main surface serving as a component main surface
103: capacitor rear surface serving as component rear surface
105: ceramic dielectric layer serving as a dielectric layer
111: obverse surface side power supplying electrode serving as a component main surface side electrode
112: obverse surface side grounding electrode serving as a component main surface side electrode
131: power supplying via conductor serving as a via conductor
132: grounding via conductor serving as a via conductor
141: first inner electrode layer serving as an inner electrode layer
142: second inner electrode layer serving as an inner electrode layer
221: main surface side opening portion serving as an opening portion
223: via hole

DETAILED DESCRIPTION OF THE INVENTION

Problem(s) to be Solved by the Invention:

In order to manufacture a wiring board having the above-mentioned connecting conductor, a step of forming a connecting conductor is necessary after fixing a capacitor to a core board and before formation of a resin insulating layer or a conductor layer. However, in the formation of the connecting conductor, a step of forming a plating layer, a step of forming an etching resist on the plating layer and a step of etching the plating layer so as to be used as a connecting conductor and a step of removing the etching resist or the like are necessary. As a result, the manufacturing step becomes complicated and the manufacturing cost of the wiring board will increase. In order to reduce the cost of the wiring board, a reduction in the number of manufacturing steps has been demanded in the recent years, and a solution for the above-mentioned problems is a must.

The present invention has been achieved in view of the above problems of the prior art, and an object of the invention is to provide a method for manufacturing a wiring board which can simplify a manufacturing step.

Means for Solving the Problem:

According to an aspect (aspect 1) for achieving the above-mentioned object, there is provided a method for manufacturing a wiring board, comprising: a preparation step of preparing a core board including a core main surface, a core rear surface, an accommodation hole opening at least at the core main surface side and a core board main surface side conductor disposed on the core main surface, and preparing an electronic component including a component main surface, a component rear surface and a component main surface side electrode disposed on the component main surface; a fixing step of fixing the electronic component to the core board by filling a gap between the electronic component and the core board with a resin filler; an insulating layer formation step of forming a lowermost resin insulating layer, which serves as a lowermost layer of a wiring laminated body, on the core main surface, the component main surface and the resin filler after the fixing step; an opening portion formation step of forming an opening portion exposing a part of the core board main surface side conductor and the component main surface side electrode by removing at least a portion of the lowermost resin insulating layer located directly above the gap; and a main surface side connecting conductor formation step of forming a main surface side connecting conductor in the opening portion and connecting the core board main surface side conductor to the capacitor main surface side electrode.

Therefore, according to the method for manufacturing the wiring board of the aspect 1, since the main surface side connecting conductor is formed in the opening portion provided in the lowermost resin insulating layer, the main surface side connecting conductor can be formed simultaneously with the formation of a conductor in the lowermost resin insulating layer. Thus, a manufacturing step is simplified, and the wiring board can be easily manufactured, thereby achieving a reduction in a manufacturing cost of the wiring board. Further, since a resin filler is a separate material from the material of the lowermost resin insulating filler, the resin filler having a strong fixing power may be used, because the function of the resin filler can be specialized in fixing the electronic component.

According to another aspect (aspect 2) for achieving the above-mentioned objects, there is provided a method for manufacturing a wiring board, comprising: a preparation step of preparing a core board including a core main surface, a core rear surface, an accommodation hole opening at least at the core main surface side and a core board main surface side conductor disposed on the core main surface, and preparing an electronic component including a component main surface, a component rear surface and a component main surface side electrode disposed on the component main surface; an insulating layer formation and fixing step of forming a lowermost resin insulating layer, which serves as a lowermost layer of a wiring laminated body, on the core main surface and the component main surface after accommodating the electronic component in the accommodation hole and fixing the electronic component to the core board by filling a gap between the electronic component and the core board with a portion of the lowermost resin insulating layer; an opening portion formation step of forming an opening portion exposing a part of the core board main surface side conductor and the component main surface side electrode by removing at least a portion of the lowermost resin insulating layer located directly above the gap; and a main surface side connecting conductor formation step of forming a main surface side connecting conductor in the opening portion and connecting the core board main surface side conductor to the component main surface side electrode.

Therefore, according to the method for manufacturing the wiring board of the second aspect, since the main surface side connecting conductor is formed in the opening portion provided in the lowermost resin insulating layer, the main surface side connecting conductor can be formed simultaneously with the formation of a conductor in the lowermost resin insulating layer. Thus, a manufacturing step is simplified, and the wiring board can be easily manufactured, thereby achieving a reduction in a manufacturing cost of the wiring board.

Furthermore, since the electronic component is fixed simultaneously with the formation of the lowermost resin insulating layer, the manufacturing step of the wiring board can be further simplified. Moreover, since the gap is filled with a part of the lowermost resin insulating layer, another material for fixing the electronic component to the core board is not necessary. Thus, since the number of materials required for manufacturing the wiring board decreases, the wiring board can be produced at low cost.

The core board of the wiring board, which constitutes a part of a core section of the wiring board, assumes a panel shape having, for example, a core main surface and a core rear surface opposite to the main core surface. The core board may have an accommodation hole for accommodating the electronic component. The accommodation hole may be a non-through hole which opens only at the core main surface, or may be a through hole which opens at both of the core main surface and the core rear surface. It is noted that "core portion" means a portion comprised of a core board and a lowermost resin insulating layer serving as a lowermost layer of the wiring laminated body. Further, the electronic component may be accommodated in the accommodation hole in the state where the entire electronic component is embedded in the accommodation hole or where a part of the electronic component projects from the opening portion of the accommodation hole.

The material of the core board is not particularly limited, but the core board is formed preferably from a polymer material as a major component. Specific examples of the polymer material forming the core board can include EP resin (epoxy resin), PI resin (polyimide resin), BT resin (bismaleimide triazine resin), and PPE resin (polyphenylene ether resin). Otherwise, a composition material of the resin and an organic fiber such as glass fiber (glass woven fabric or glass non-woven fabric) and polyamide fiber may be used.

In addition, the core board main surface side conductor is a plane-shaped conductor or a net-shaped conductor formed so as to surround the opening edge of the accommodation hole and is preferably connected to a plurality of the through-hole conductors which is formed so as to penetrate both of the core main surface and the core rear surface. With this structure, the cross-sectional area of the core board main surface side conductor becomes large, thereby attaining a low resistance. Therefore, a large amount of power can be easily fed using the electrical pathway connected to the component main surface side electrode through the through-hole conductor, the core board main surface side conductor and the main surface side connecting conductor.

The electronic component constituting the wiring board has a component main surface and a component rear surface. The electronic component is embedded in the accommodation hole.

An example of the electronic component includes a capacitor having a plurality of via conductors formed so as to penetrate the component main surface and the component rear surface, a plurality of inner electrode layers connected to the plurality of via conductors and laminated with a dielectric layer interposed therebetween and the component main surface side electrode connected to an end portion of the plurality of via conductors at the component main surface side. Another example of the electronic component includes a ceramic chip having a sintered ceramic body which includes a component main surface and a component rear surface, a plurality of via conductors formed so as to penetrate the component main surface and the component rear surface and the component main surface side electrode connected to an end portion of the plurality of via conductors at the component main surface side, but not include a plurality of inner electrode layers, which no capacitor function is provided. It is noted when a capacitor is used as the electronic component, it is possible to easily accomplish the decrease in size of the whole capacitor and to easily accomplish the decrease in size of the whole wiring board. Further, it is easy to accomplish a high electrostatic capacity in spite of its compact size, thereby more stably supplying the electrical power.

In addition, the area of the component main surface (and the component rear surface) of the electronic component is preferably smaller than that of the opening portion of the accommodation hole, more preferably, it is slightly smaller than the area of the opening portion of the accommodation hole. With this structure, the gap between the electronic component accommodated in the accommodation hole and the core board becomes small. As a result, an area not having any electrical function in the wiring board can be lessened, thereby achieving a decrease in size of the wiring board. Further, the shape of the electronic component as viewed in the plane view preferably resembles a shape of the accommodation hole as viewed in the plane view. For example, when the accommodation hole assumes a rectangular form as viewed in the plane view, the shape of the electronic component preferably assumes a rectangular form as viewed in the plane view. In this way, the gap becomes smaller, and the area not having any electrical function in the wiring board can also be lessened further.

As the ceramic dielectric layer, a sintered body of high-temperature baked ceramics such as alumina, aluminum nitride, boron nitride, silicon carbide, and silicon nitride, or a sintered body of low-temperature baked ceramics, such as glass ceramics in which an inorganic ceramic filler, such as alumina, is added to borosilicate glass or lead borosilicate glass is suitably used. In this case, it is preferable that a sintered body of dielectric ceramics such as barium titanate, lead titanate, and strontium titanate is used depending upon applications thereof. When the sintered body of dielectric ceramics is used, it is easy to embody a ceramic capacitor with a high electrostatic capacity.

The material of the inner electrode layers and the via conductors is not particularly limited, but metal such as nickel, molybdenum, tungsten, and titanium which can be sintered at the same time as sintering ceramics can be suitably used. When the sintered body of low-temperature baked ceramics is selected, copper or silver can be used as the material of the inner electrode layers and the via conductors.

The wiring laminated body has a structure in which the interlayer insulating layer made of polymer material as a major component and the conductor layer are alternately laminated. Although there is a large difference in pitch between the terminal groups at the integrated circuit element side and the electronic component side when the integrated circuit element is mounted on the surface of the wiring laminated body, they can be easily connected through the wiring laminated body. Further, although the wiring laminated body is formed only on the core main surface and the component main surface, another wiring laminated body having the structure in which the interlayer insulating layer and the conductor are alternately laminated on the core rear surface and the component rear surface may be further formed. In this case, since the electric circuits can be formed in both of the wiring laminated bodies, it is possible to further accomplish the enhancement in performance of the wiring board.

It is noted that the component main surface side electrodes may be disposed on suitable positions of the component main surface. However, the component main surface side electrode is preferably also disposed specifically in an outer circumference portion of the electronic component. In this case, since the distance between the component main surface side electrode and the main surface side connecting conductor is shortened, it is easy to connect the core board main surface side conductor to the component main surface side electrode through the main surface side connecting conductor.

Further, when the electronic component has a generally rectangular shape as viewed in a plane view, the main surface side connecting conductor may be a belt-like pattern disposed at least one each in each side of the electronic component, or disposed plurally in each side thereof. Further, the main surface side connecting conductor may be a rectangular-frame like pattern which is formed so as to cover the whole region of the gap between the electronic component and the core board. When the main surface side connecting conductor is the belt-like pattern disposed at least one each in each side of the electronic component, the number of the main surface side connecting conductor increases, thereby increasing the number of the electrical pathways connected to the component main surface side electrode. As a result, a low resistance can be attained, and the variation in electric potential in each side of the electronic component can be prevented. On the other hand, when the main surface side connecting conductor is the belt-like pattern, and a plurality of belt-like patterns are disposed on each side of the electronic component, the number of main surface side connecting conductors further increases, thereby increasing in the number of electrical pathways. As a result, a low resistance can be further facilitated. Moreover, when the main surface side connecting conductor is a rectangular-frame like pattern, the number of electrical pathways does not increase, but the cross-sectional area of the main surface side connecting conductor is larger than that of the belt-like pattern, thereby further achieving a low resistance.

Hereafter, the method for manufacturing the wiring board will be explained.

In the preparation step, the electronic component and the core board having the accommodation hole for accommodating the component are previously manufactured and prepared by the use of known methods. For example, the electronic component is manufactured as follows. A paste is printed on the component main surface of an electronic component main body to form the component main surface side electrode. Next, thus-printed paste and the electronic component main body are baked at a predetermined temperature for a predetermined time. As a result, they are simultaneously sintered to form the electronic component. For example, the core board is manufactured as follows. A sub substrate is formed on an obverse surface and a reverse surface of a substrate, and a core board main surface side conductor is formed on the obverse surface of an upper sub substrate. Next, by punching a laminated body composed of the substrate and the sub substrates using a router, a through hole which becomes the accommodation hole is formed at a predetermined position to produce the core board According to the manufacturing method of aspect 1, the following steps are performed after the preparation step. That is, in the fixing step, a masking material, such as an adhesive tape, is stuck on the rear surface of the core board to seal the rear surface side opening of the accommodation hole beforehand, and then an electronic component is accommodated in the accommodation hole. In this state, the resin filler made of polymer material is filled in the gap between an inner face of the accommodation hole and a side face of the electronic component. A thermosetting resin is preferably used as a resin filler. When the thermosetting resin is used, a heat-treatment is performed after filling the gap. As a result, the electronic component is fixed in the accommodation hole by the hardened resin filler. After the fixing step, the insulating layer formation step is performed to form the lowermost resin insulating layer on a main surface (the core main surface, the component main surface and a main surface side wiring forming portion of the resin filler) of a compound base material.

A method for filling the gap with the resin filler includes a use of a dispenser device or a paste printing of the resin filler, etc. At the time of performing the insulating layer formation step, the main surface of the compound base material may be ground so as to be flattened.

On the other hand, according to the manufacturing method of aspect 2, the following steps are performed after the preparation step. That is, in the insulating layer formation and fixing step, the electronic component is accommodated and fixed in the accommodation hole by the same method as the first aspect and then the lowermost resin insulating layer is formed on the main surface (the core main surface and the component main surface) of the compound base material. At the same time, the gap between the inner face of the accommodation hole and the side face of the electronic component is filled with a part of the lowermost resin insulating layer. As a result, the electronic component is fixed by a part of the lowermost resin insulating layer in the accommodation hole.

The opening portion formation step is performed after the insulating layer formation step or the insulating layer formation and fixing step. More particularly, at least a part of the lowermost resin insulating layer located directly above the gap is removed to form the opening portion exposing a part of the core board main surface side conductor and the component main surface side electrode. Examples of the method for forming the opening portion include a punching process using a drill machine, a router processing, a laser processing and a photolithography where an exposure and a development are conducted. However, when the laser processing is used, the core board main surface side conductor and the component main surface side electrode are unlikely to be damaged during the opening portion formation step. In the opening portion formation step, a via hole exposing the component main surface side electrode is preferably formed by the laser processing to the lowermost resin insulating layer while forming the opening portion. In this way, since the opening portion and the via hole are formed collectively, the manufacturing step can be simplified, thereby resulting in a reduction in the manufacturing cost of the wiring board.

Further, the main surface side connecting conductor formation step is performed so as to form the main surface side connecting conductor in the opening portion and connect the core board main surface side conductor to the component main surface side electrode.

Examples of the main surface side connecting conductor include a metal-plating layer, a metal paste layer, a metallic foil pasting layer, a sputtering layer, a deposition layer, an ion plating layer or the like, however, the metal-plating layer (e.g., copper plating layer) is particularly suitable. The reason is that the relatively thick metal-plating layer can be formed in a short period of time whereby it is advantageous to produce the wiring board at low cost. It is noted that when the main surface side connecting conductor is a plating layer, the main surface side connecting conductor is formed by electroless plating in the main surface side connecting conductor formation step.

In the main surface side connecting conductor formation step, the main surface side connecting conductor is preferably formed in the opening portion by way of forming an etching resist on the lowermost resin insulating layer and an inner face of the opening portion after applying an electroless plating thereto, subsequently, applying an electrolytic plating thereto, and applying a soft etching after removing the thus-applied etching resist. At the same time, the conductor layer constituting the wiring laminated body is preferably pattern printed on the lowermost resin insulating layer. In this way, the main surface side connecting conductor is thickly formed with the electroless plating layer and the electrolytic plating layer. As a result, the resistance of the main surface side connecting conductor becomes small, and the voltage drop at the time of a current supply is also reduced. Thus, a large electrical current can be fed through the main surface side connecting conductor. Further, the formation of the main surface side connecting conductor and the pattern formation of the conductor layer are simultaneously performed, the manufacturing step can be simplified further whereby the cost of the wiring board can be reduced.

In addition, when each contact area of the main surface side connecting conductor and the core board main surface side conductor is enlarged, the connection reliability between the main surface side connecting conductor and the core board main surface side conductor becomes high. As a method for enlarging both contact areas, for example, the main surface side connecting conductor joins both of a side face and an obverse surface of the core board main surface side conductor. Similarly, when each contact area of the main surface side connecting conductor and the component main surface side electrode is enlarged, the connection reliability between the main surface side connecting conductor and the component main surface side electrode becomes high. As a method for enlarging both contact areas, for example, the main surface side connecting conductor joins both of a side face and an obverse surface of the component main surface side electrode.

As mentioned above, in the main surface side connecting conductor formation step, when the main surface side connecting conductor joins the plural faces of the core board main surface side conductor or the component main surface side electrode, a concave portion may be made on the obverse surface of the main surface side connecting conductor. In this case, after the main surface side connecting conductor formation step, a filling step of filling the concave portion generated in the main surface side connecting conductor with an insulating material is preferably conducted so as to flatten the obverse surface of the main surface side connecting conductor. In this case, the conductor layer may be formed on the obverse surface of the main surface side connecting conductor where the concave portion is flattened, thereby improving the degree of freedom of the wiring design in the wiring laminated body. Furthermore, a filling step is preferably conducted by way of filling a hollow portion of the plurality of through-hole conductors formed so as to penetrate the core board and the lowermost resin insulating layer with an insulating resin material, while filling a concave portion generated in the main surface side connecting conductor. In this case, since the hollow portion of the conductor and the concave portion are filled in the same time, the manufacturing step can be further simplified, thereby achieving a reduction in the manufacturing cost of the wiring board.

Best Mode of Carrying Out the Invention:

First Embodiment

Hereafter, a first embodiment for carrying out a wiring board of the present invention will be described in detail with reference to the drawings.

As shown in FIG. 1, a wiring board 10 according to this embodiment is a wiring board for mounting an IC chip and is composed of: a core board 11 assuming a generally rectangular form; a first wiring laminated body formed on a core main surface 12 (obverse surface in FIG. 1) of the core board 11; and a second wiring laminated body formed on a core rear surface 13 (reverse surface in FIG. 1) of the core board 11. The first wiring laminated body is composed of: a lowermost resin insulating layer 33 made of epoxy resin and constituting a lowermost layer of the first wiring laminated body; and a first buildup layer 31 formed on the lowermost resin insulating layer 33. On the other hand, the second wiring laminated body is composed of: an uppermost resin insulating layer 34 made of epoxy resin and constituting an uppermost layer of the second wiring laminated body; and a second buildup layer 32 formed on the uppermost resin insulating layer 34.

Via conductors 47 are formed in plural locations in the lowermost resin insulating layer 33 which constitutes the first wiring laminated body. The first buildup layer 31 which constitutes the first wiring laminated body has a structure where a resin insulating layer 35 (hereinafter referred to as an interlayer insulating layer) comprised of epoxy resin and a conductor layer 42 comprised of copper are alternately laminated. The conductor layer 42 is electrically connected to the via conductor 47 or the like. Further, via conductors 43 are formed in plural locations in the resin insulating layer 35. Terminal pads 44 are formed in the locations where an upper end of the via conductor 43 is disposed on an obverse surface of the resin insulating layer 35 in an array form. Moreover, the surface of the resin insulating layer 35 is almost entirely covered with a solder resist 37. Opening portions 46 to which the terminal pads 44 are exposed are formed in the predetermined locations of the solder resist 37. Plural solder bumps 45 are disposed on the surface of the terminal pad 44. Each solder bump 45 is electrically connected to planar connection terminals 22 of an IC chip 21 (semiconductor integrated circuit element). The IC chip 21 assumes a rectangular plate-like form and is made of silicon. In addition, in the first buildup layer 31, each terminal pad 44 and each solder bump 45 are located within an area right above a ceramic capacitor 101. This area serves as an IC chip mounting area 23. The IC chip mounting area 23 is formed on a top surface 39 of the first buildup layer 31. That is, the IC chip 21 can be mounted on the top surface 39.

As shown in FIG. 1, the second wiring laminated body has the almost same structure as that of the first wiring laminated body. That is, via conductors 47 are formed in plural locations in the uppermost resin insulating layer 34 which constitutes the second wiring laminated body. The second buildup layer 32 which constitutes the second wiring laminated body has a structure where a resin insulating layer 36 (hereinafter referred to as an interlayer insulating layer) comprised of epoxy resin and the conductor layer 42 are alternately laminated. The conductor layer 42 is electrically connected to the via conductor 47 or the like. Further, via conductors 43 are formed in plural locations in the resin insulating layer 36. BGA (ball grid array) pads 48 are formed in the locations where a lower end of the via conductor 43 is disposed on a reverse surface of the resin insulating layer 36 in an array form. Moreover, the reverse surface of the resin insulating layer 36 is almost entirely covered with a solder resist 38. Opening portions 40 to which the BGA pads 48 are exposed are formed in the predetermined locations of the solder resist 38. Plural solder bumps 49 are disposed on the surface of the BGA pad 48 so as to be electrically connected to a motherboard (not illustrated). Then, the wiring board 10 is mounted on the motherboard (not illustrated) through each solder bump 49. That is, the motherboard can be connected to a surface of the second buildup layer 32.

As shown in FIG. 1, the core board 11 is composed of: a substrate 201 made of glass epoxy; a sub substrate 204 formed on both of an obverse surface and a reverse surface of the substrate 201 and made of epoxy resin to which inorganic filler, such as a silica filler, is added; and a conductor layer 203 formed on both of the obverse surface and the reverse surface of the substrate 201 and made of copper. Moreover, a plurality of through-hole conductors 16 formed so as to penetrate the core main surface 12 and the core rear surface 13, and the conductor layer 203 is formed in the core board 11. The through-hole conductors 16 electrically connect the core main surface 12 and the core rear surface 13 as well as being connected to the conductor layer 203. The inside of the through-hole conductor 16 is filled with a filler 17 such as epoxy resin. An upper end of the through-hole conductor 16 is electrically connected to a part of the conductor layer 42 disposed on the surface of lowermost resin insulating layer 33. The lower end of the through-hole conductor 16 is electrically connected to a part of conductor layer 42 disposed on the reverse surface of the uppermost resin insulating layer 34. Moreover, the core board 11 includes a rectangular-shaped accommodation hole 90 as viewed in a plane view which opens at the center of the core main surface 12 and the core rear surface 13. That is, the accommodation hole 90 is a through hole.

Figure 2:
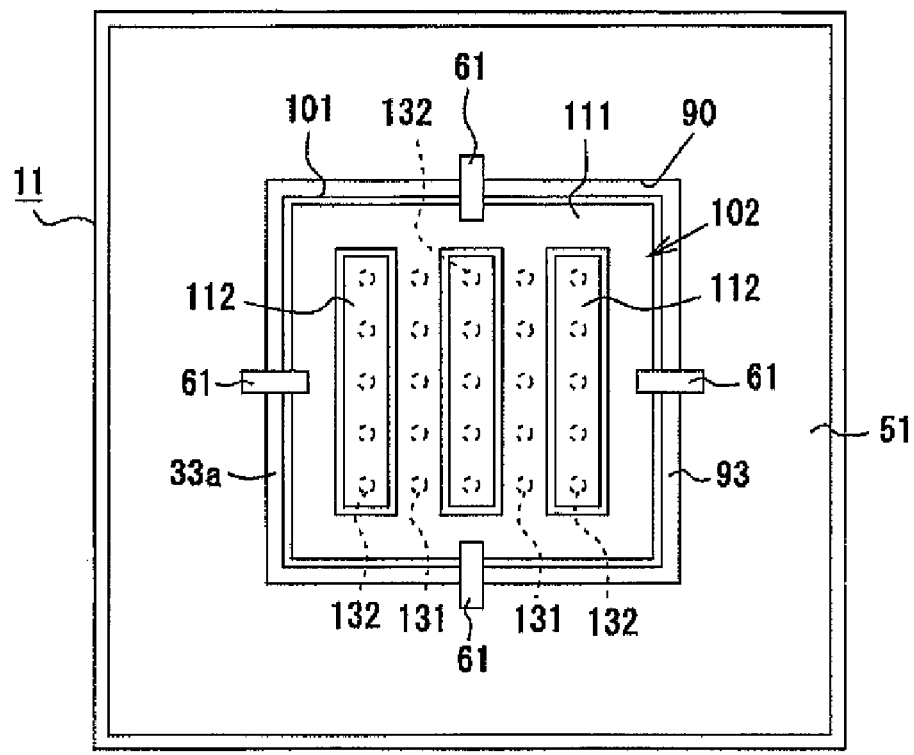
FIG. 2 is a schematic plan view showing a relation among a core board, a ceramic capacitor and an obverse surface side connecting pattern according to a first embodiment.
Figure 3:
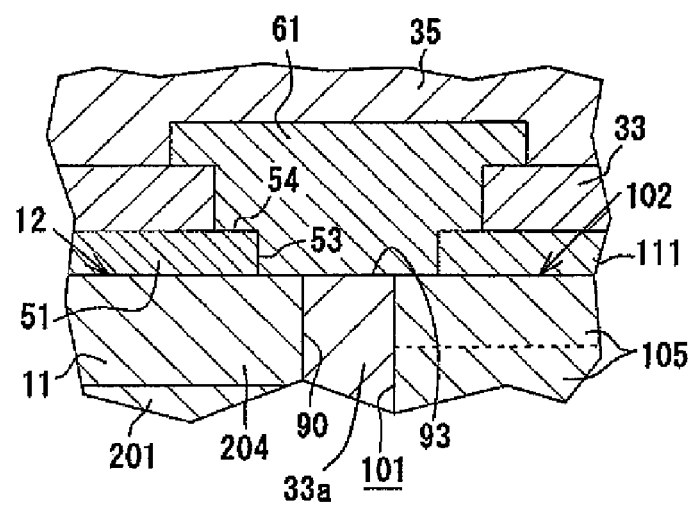
FIG. 3 is a sectional view of an essential portion describing a connection with an obverse surface side connecting pattern according to a first embodiment.

As shown in FIGS. 1 to 3, a core board main surface side power supplying pattern 51 (a core board main surface side conductor) made of copper is disposed on the core main surface 12 of the core board 11. Also, a core board rear surface side grounding pattern 52 (core board rear surface side conductor) made of copper is disposed on the core rear surface 13 of the core board 11. The core board main surface side power supplying pattern 51 and the core board rear surface side grounding pattern 52 are electrically connected to the through-hole conductor 16. The core board main surface side power supplying pattern 51 and the core board rear surface side grounding pattern 52 are thicker than the conductor layer 42. In addition, in this embodiment, the thickness of the conductor layer 42 is 25 μm, and that of the core board main surface side power supplying pattern 51 and the core board rear surface side grounding pattern 52 is 35 μm, respectively. The core board main surface side power supplying pattern 51 and the core board rear surface side grounding pattern 52 are plane conductors formed in a rectangular shape so as to surround an opening edge of the accommodation hole 90 (refer to FIG. 2). In addition, the outer circumference edges of the core board main surface side power supplying pattern 51 and the core board rear surface side grounding pattern 52 are disposed, respectively, at the inner side of the outer circumference edge of the core main surface 12 and that of the core rear surface 13 of the core board 11. The inner circumference edges of the core board main surface side power supplying pattern 51 and the core board rear surface side grounding pattern 52 are disposed, respectively, at the outer circumference side of the opening edge of the accommodation hole 90 toward the core board 11.

Figure 4:
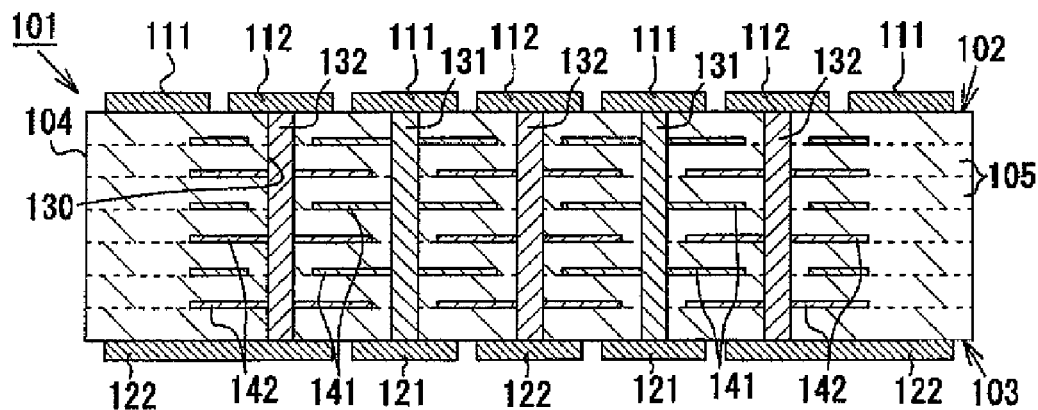
FIG. 4 is a schematic sectional view showing a ceramic capacitor according to a first embodiment.
Figure 5:
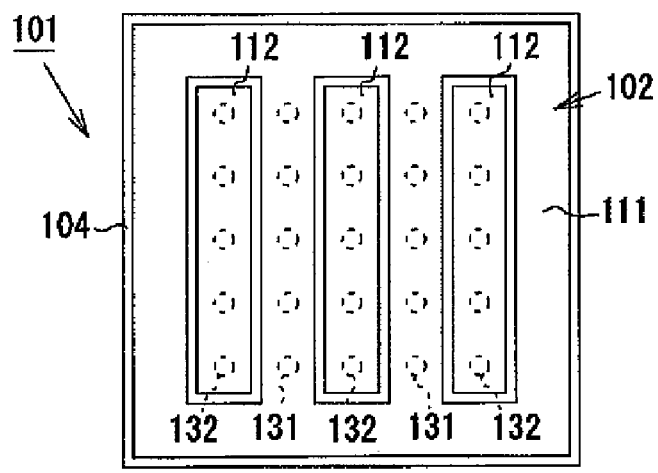
FIG. 5 is a schematic plan view showing an obverse surface of a ceramic capacitor according to a first embodiment.
Figure 6:
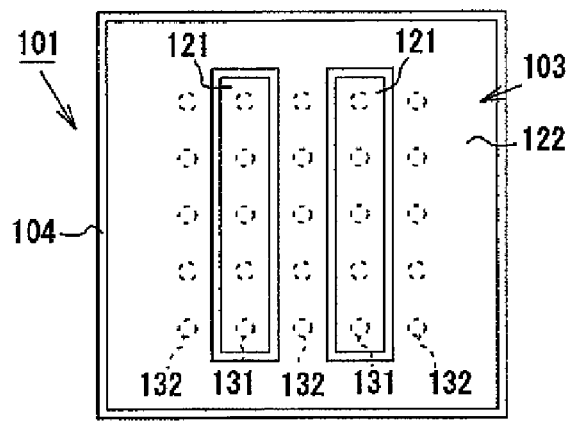
FIG. 6 is a schematic plan view showing a reverse surface of a ceramic capacitor according to a first embodiment.

A ceramic capacitor 101 shown in FIGS. 4 to 6 are embedded and accommodated in the accommodation hole 90. In this embodiment, the ceramic capacitor 101 has a rectangular panel shape with longitudinal length 6.0 mm×lateral length 12.0 mm×thickness 0.8 mm. The thickness of the ceramic capacitor 101 is preferably in the range of 0.2 mm to 1.0 mm. When the thickness is less than 0.2 mm, the stress at the time of bonding the IC chip 21 to the IC chip mounting region 23 cannot be reduced by the ceramic capacitor 101 and thus the ceramic capacitor is not satisfactory as a support. On the other hand, when the thickness is larger than 1.0 mm, the thickness of the wiring board 10 is too great. The thickness of the ceramic capacitor 101 is more preferably in the range of 0.4 mm to 0.8 mm. The ceramic capacitor 101 is disposed right below the IC chip mounting region 23 in the core board 11. The area of the IC chip mounting region 23 (the area of the surface on which the surface connection terminals 22 in the IC chip 21) is set smaller than the area of the main surface 102 of the ceramic capacitor 101. As viewed in the thickness direction of the ceramic capacitor 101, the IC chip mounting region 23 is located in the main surface 102 of the ceramic capacitor 101. It is noted that the size of the IC chip mounting region 23 as described above is not limited, but the IC chip mounting region 23 may be larger than the area of the capacitor main surface 102.

As shown in FIG. 1, FIGS. 4 to 6, the ceramic capacitor 101 (electronic component) according to this embodiment is a so-called via array type ceramic capacitor. A sintered ceramic body 104 constituting the ceramic capacitor 101 assumes a plate shape having a capacitor main surface 102 serving as a component main surface (obverse surface in FIG. 1) and a capacitor rear surface 103 serving as a component rear surface (reverse surface in FIG. 1). The resin insulating layer 33 is formed on the capacitor main surface 102 of the sintered ceramic body 104 and the resin insulating layer 34 is formed on the capacitor rear surface 103 of the sintered ceramic body 104. The sintered ceramic body 104 has a structure in which a first inner electrode layer 141 and a second inner electrode layer 142 are alternately laminated with a ceramic dielectric layer 105 interposed therebetween. The ceramic dielectric layer 105 is formed of a sintered body of barium titanate which is a kind of high dielectric ceramics and serves as a dielectric (insulating layer) between the first inner electrode layer 141 and the second inner electrode layer 142. The first inner electrode layer 141 and the second inner electrode layer 142 all contain nickel as a major component and are disposed every other layer in the sintered ceramic body 104.

A plurality of via holes 130 is formed in the sintered ceramic body 104. These via holes 130 penetrate the sintered ceramic body 104 in the thickness direction and are disposed in a lattice pattern (array form) over the whole surface. In each via hole 130, a plurality of via conductors 131, 132 comprised mainly of nickel are formed so as to communicate between the capacitor main surface 102 and the capacitor rear surface 103 of the sintered ceramic body 104. The upper end of the via conductor 131, 132 is disposed on the capacitor main surface 102, and the lower end of the via conductor 131, 132 is disposed on the capacitor rear surface 103. Each power supplying via conductor 131 penetrates each first inner electrode layer 141 so that the first inner electrode layers 141 are electrically connected to each other. Each grounding via conductor 132 penetrates each second inner electrode layer 142 so that the second inner electrode layers 142 are electrically connected to each other. Each power supplying via conductor 131 and each grounding via conductor 132 are disposed in an array form as a whole. For the purpose of convenient explanation, the via conductors 131, 132 are shown in 5 rows×5 columns, but more rows and columns are disposed in practice.

As shown in FIG. 2, FIGS. 4 to 6, a plurality of obverse surface side power supplying electrodes 111 (component main surface side electrode) and a plurality of obverse surface side grounding electrode 112 (component main surface side electrode) protrude from the capacitor main surface 102 of the sintered ceramic body 104. In addition, a plurality of rear surface side power supplying electrode 121 (component rear surface side electrode) and a plurality of rear surface side grounding electrode 122 (component rear surface side electrode) protrude from the capacitor rear surface 103 of the sintered ceramic body 104. The obverse surface side power supplying electrode 111 is a plane conductor which covers almost the entirety of the capacitor main surface 102, and has a plurality of holes so as to avoid the obverse surface side grounding electrode 112. Similarly, the rear surface side grounding electrode 122 is a plane conductor which covers almost the entirety of the capacitor rear surface 103, and has a plurality of holes so as to avoid the rear surface side power supply electrode 121. In addition, the outer circumference edges of the obverse surface side power supplying electrode 111 and the rear surface side grounding electrode 122 are disposed, respectively, at the inner side of the outer circumference edges of the capacitor main surface 102 and that of the capacitor rear surface 103 of the ceramic capacitor 101 (refer to FIG. 2, FIG. 5 and FIG. 6). Moreover, the obverse surface side grounding electrode 112 is a belt-like pattern disposed in parallel on the capacitor main surface 102, and the rear surface side power supplying electrode 121 is also a belt-like pattern disposed in parallel on the capacitor rear surface 103. The electrodes 111, 112 on the capacitor main surface 102 are electrically connected to the IC chip 21 through the via conductors 47, the first buildup layer 31 (conductor layer 42, via conductor 43), the terminal pad 44, the solder bumps 45 and the surface connection terminal 22 of the IC chip 21. On the other hand, the electrodes 121, 122 on the capacitor rear surface 103 are electrically connected to electrodes (contactors) of the motherboard (not illustrated) through the via conductors 47, the conductor layer 42, the via conductors 43, the BGA pads 48 and the solder bumps 49. Further, a plurality of obverse surface side power supplying electrodes 111 is directly connected to the end faces of plural power supplying via conductors 131 disposed at the capacitor main surface 102 side. A plurality of obverse surface side grounding electrodes 112 is directly connected to the end faces of the plural grounding via conductors 132 disposed at the capacitor main surface 102 side. On the other hand, a plurality of rear surface side power supplying electrodes 121 is directly connected to the end faces of the plural power supplying via conductors 131 disposed at the capacitor rear surface 103. A plurality of rear surface side grounding electrodes 122 is directly connected to the end faces of plural grounding via conductors 132 disposed at the capacitor rear surface 103 side. Thus, the power supplying electrodes 111, 112 are connected directly to the power supplying via conductors 131 and the first inner electrode layers 141, and the grounding electrodes 112, 122 are connected directly to the grounding via conductors 132 and the second inner electrode layers 142.

As shown in FIG. 4, the electrodes 111, 112 are formed mainly from nickel and the surfaces thereof are coated with a copper plating layer as a whole. Similarly, the electrodes 121, 122 are also formed mainly from nickel and the surfaces thereof are coated with a copper plating layer. These electrodes 121, 122 and the via conductors 131, 132 are disposed directly under the generally central portion of the IC chip 21. The obverse surface side power supplying electrodes 111 and the obverse surface side grounding electrodes 112 are formed directly under the generally central portion of the IC chip 21 towards the outer circumference direction of the ceramic capacitor 101. In addition, the obverse surface side power supplying electrodes 111 and the rear surface side grounding electrodes 122 are also disposed on the outer circumference portion of the capacitor.

For example, when electrical power is applied through the electrodes 121, 122 from the motherboard and a voltage is applied across the first inner electrode layers 141 and the second inner electrode layers 142, for example, plus electric charges are accumulated on the first inner electrode layers 141 and for example, minus electric charges are accumulated on the second inner electrode layers 142. As a result, the ceramic capacitor 101 serves as a capacitor. In the ceramic capacitor 101, the first power supplying via conductors 131 and the grounding via conductors 132 are alternately disposed adjacent to each other and the directions of current flowing through the power supplying via conductors 131 and the ground via conductors 132 are set opposite to each other. Accordingly, inductance components are reduced.

As shown in FIGS. 1 to 3, a resin filler 33a constituting a part of the lowermost resin insulating layer 33 is filled between an inner face of the accommodation hole 90 and the side face of the ceramic capacitor 101. The resin filler 33a fixes the ceramic capacitor 101 to the core board 11 while preventing a deformation of the ceramic capacitor 101 and the core board 11 in the plane direction and thickness direction thereof by its own elastic deformation. In addition, the ceramic capacitor 101 assumes a generally square shape as viewed in the plane view, and has a taper of C0.6 (0.6 mm) in the four corners. In other words, the four corners are chamfered or beveled to eliminate sharp corners. Thus, when any deformation of the resin filler 33a arises due to a temperature variation, it is possible to alleviate a stress concentration to the corner of the ceramic capacitor 101, thereby preventing a crack of the resin filler 33a.

The resin filler 33a has a main surface side wiring forming portion 93 located on the core main surface 12 of the core board 11 and the capacitor main surface 102 of the ceramic capacitor 101. Moreover, the resin filler 33a has a rear surface side wiring forming portion 94 located on the core rear surface 13 of the core board 11 and the capacitor rear surface 103 of the ceramic capacitor 101. An obverse surface side connecting pattern 61 (main surface side connecting conductor) is formed on the main surface side wiring forming portion 93. The obverse surface side connecting pattern 61 is formed in a belt-like pattern disposed on each side of the ceramic capacitor 101 (refer to FIG. 2) so as to connect the core board main surface side power supplying pattern 51 to the obverse surface side power supplying electrode 111. More particularly, one end of the obverse surface side connecting pattern 61 joins a side face 53 (inner circumference face) and an obverse surface 54 of the core board main surface side power supplying pattern 51, while the other end of the obverse surface side connecting pattern 61 joins a side face (outer circumference face) and an obverse surface of the obverse surface side power supplying electrode 111 (refer to FIG. 3). It is noted that the obverse surface side connecting pattern 61 of this embodiment is made of a copper plating layer, and the obverse surface thereof is flat.

As shown in FIGS. 1 and 3, a rear surface side connecting pattern 62 (rear surface side connecting conductor) is disposed on the rear surface side wiring portion 94. The rear surface side connecting pattern 62 has almost the same composition as of the obverse surface side connecting pattern 61. That is, the rear surface side connecting pattern 62 is a belt-like pattern disposed on four sides of the ceramic capacitor 101 so as to connect the core board rear surface side grounding pattern 52 to the rear surface side grounding electrode 122. More particularly, the rear surface side connecting pattern 62 joins a side face (inner circumference face) and a reverse surface of the core board rear surface side grounding pattern 52, and also joins a side face (outer circumference face) and a reverse surface of the rear surface side grounding electrode 122. In addition, the rear surface side connecting pattern 62 of this embodiment is made of a copper plating layer, and the rear surface thereof is flat.

With the structure described above, a plurality of electrical pathways (a first power supply pathway, a second power supply pathway or the like) for supplying an electrical power to the IC chip 21 are formed in the wiring board 10. The first power supply pathway is connected to the obverse surface side power supplying electrode 111 through the through-hole conductor 16, the core board main surface side power supplying pattern 51 and the obverse surface side connecting pattern 61. The second power supply pathway is connected to the obverse surface side power supplying electrode 111 through the via conductor 131. Further, the obverse surface side power supplying electrode 111 is electrically connected to the IC chip 21 through the via conductor 47, the first buildup layer 31 (the conductor layer 42, the via conductor 43), the terminal pad 44, the solder bumps 45 and the surface connection terminal 22 of the IC chip 21.

Next, a method of manufacturing the wiring board 10 according to the embodiment will be described.

In a preparation step, the core board 11 and the ceramic capacitor 101 are previously manufactured and prepared by the use of known methods.

Figure 7:
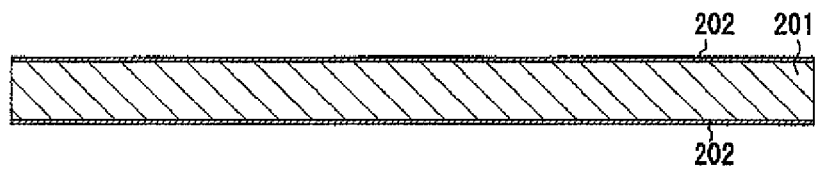
FIG. 7 is an explanatory view of a manufacturing method of a wiring board according to a first embodiment.
Figure 8:
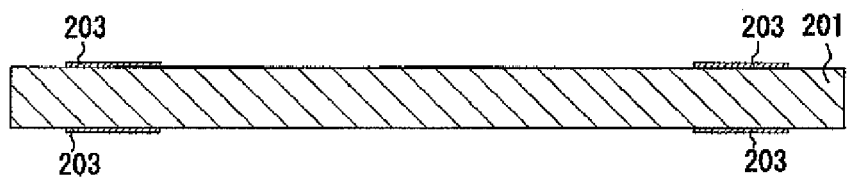
FIG. 8 is an explanatory view of a manufacturing method of a wiring board according to a first embodiment.
Figure 9:
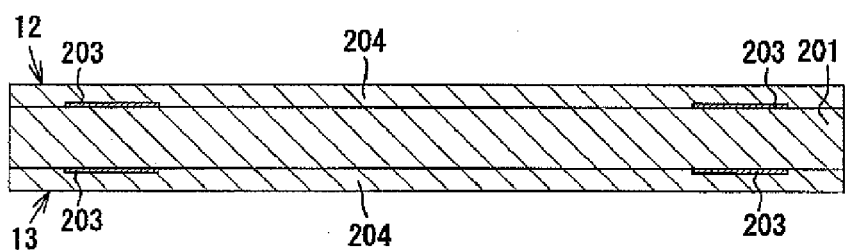
FIG. 9 is an explanatory view of a manufacturing method of a wiring board according to a first embodiment.

The core board 11 is manufactured as follows. First, a copper coated plate in which a copper foil 202 with a thickness of 35 μm is bonded to both surfaces of the substrate 201 with longitudinal length 400 mm×lateral length of 400 mm×thickness 0.8 mm is prepared (refer to FIG. 7). The thickness of the substrate 201 is preferably in the range of 0.2 mm to 1.0 mm. The conductor layer 203 is patterned using, for example, a subtractive method by etching the copper foil 202 on both surfaces of the copper coated plate (refer to FIG. 8). Specifically, after an electroless copper plating process, an electrolytic copper plating process is performed using the electroless copper plating layer as a common electrode. A dry film is laminated thereon and the dry film is formed in a predetermined pattern by exposing and developing the dry film. In this state, an unnecessary electrolytic copper plating layer, an unnecessary electroless copper plating layer, and an unnecessary copper foil 202 are removed by etching. Thereafter, the dry film is peeled off. Next, after roughening the obverse surface and the rear surface of the substrate 201 and the conductor layer 203, an epoxy resin film (600 μm in thickness) in which the inorganic filler is added is laminated by a thermocompression on the obverse surface and the rear surface of the substrate 201, thereby producing the sub substrate 204 (refer to FIG. 9).

Figure 10:
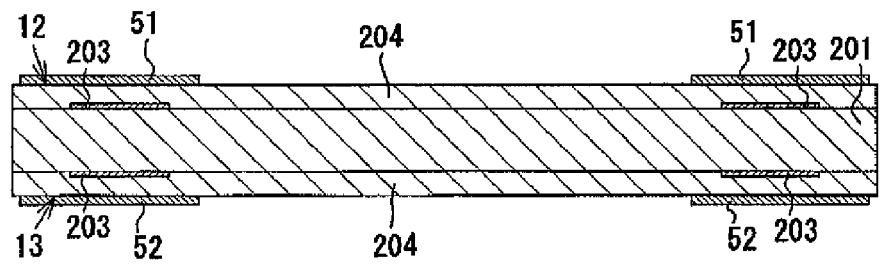
FIG. 10 is an explanatory view of a manufacturing method of a wiring board according to a first embodiment.
Figure 11:
FIG. 11 is an explanatory view of a manufacturing method of a wiring board according to a first embodiment.

Next, a core board main surface side power supplying pattern 51 is formed on the obverse surface of the upper sub substrate 204, while the core board rear surface side grounding pattern 52 is formed on the rear surface of the lower sub substrate 204 (refer to FIG. 10). More particularly, after an electroless copper plating is applied to the obverse surface of the upper sub substrate 204 and the rear surface of the lower sub substrate 204, an etching resist is formed thereon, and subsequently the electrolytic copper plating is applied. Furthermore, etching resist is removed and then a soft etching is applied. Next, by punching a laminated body composed of the substrate 201 and the sub substrates 204 using a router, a through hole which becomes the accommodation hole 90 is formed at a predetermined position to produce the core board 11 (see FIG. 11). The through hole which becomes the accommodation hole 90 is a rectangular sectional shape with a longitudinal length 14.0 mm×a lateral length 30.0 mm and R of a radius 1.5 mm at four corners thereof.

The ceramic capacitor 101 is manufactured as follows. That is, a ceramic green sheet is formed, and nickel paste for inner electrodes is printed and dried on the green sheet by using a screen printing method. In this way, a first inner electrode portion which becomes the first inner electrode layer 141 and a second inner electrode portion which becomes the second inner electrode layer 142 are formed. Next, by alternately laminating the green sheet in which the first inner electrode portion is formed and the green sheet in which the second inner electrode portion is formed and applying a pressing force thereto in the sheet stacking direction, the green sheets are integrated to form a green sheet laminate.

A plurality of via holes 130 are formed in the green sheet laminate by the use of a laser processing machine and the nickel paste for via conductors is filled in the via holes 130 by the use of a paste pressing and filling machine not shown.

Next, paste is printed on the obverse surface of the green sheet laminate and the obverse surface side power supplying electrodes 111 and the obverse surface side ground electrodes 112 are formed so as to cover the upper ends of the conductor portions at the obverse surface of the green sheet laminate. In addition, paste is printed on the rear surface of the green sheet laminate and the rear surface side power supplying electrodes 121 and the rear surface side ground electrodes 122 are formed so as to cover the lower ends of the conductor portions from the reverse surface of the green sheet laminate.

Thereafter, the green sheet laminate is dried to solidify each electrode 111, 112, 121, 122 to some extent. Next, the green sheet laminate is defatted and baked at a predetermined temperature for a predetermined time. As a result, barium titanate and nickel in the paste are simultaneously sintered to form the sintered ceramic body 104.

Next, an electroless copper plating process (with a thickness of about 10 μm) is applied to each electrode 111, 112, 121, 122 of the obtained sintered ceramic body 104. As a result, a copper coating layer is formed on each electrode 111, 112, 121, 122, thereby completing the ceramic capacitor 101.

Figure 12:
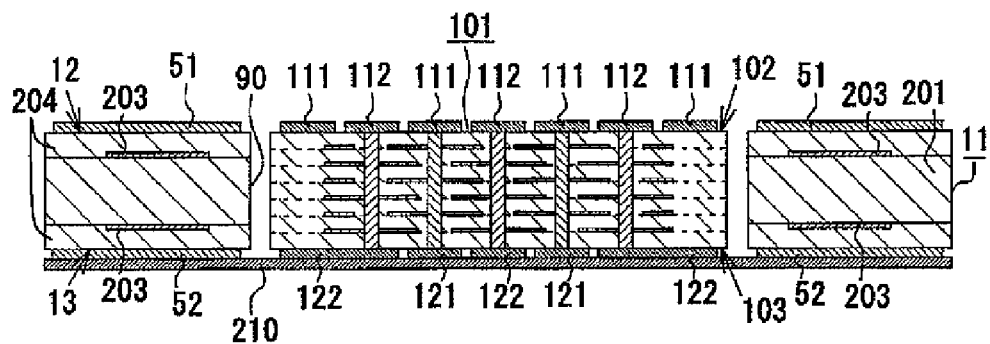
FIG. 12 is an explanatory view of a manufacturing method of a wiring board according to a first embodiment.

In the subsequent insulating layer formation and fixing step, the ceramic capacitor 101 is accommodated in the accommodation hole 90 by the use of a mounting machine (made by Yamaha Motor Co., Ltd.) (refer to FIG. 12). At this time, the opening of the accommodation hole 90 at the core rear surface 13 is sealed with an adhesive tape 210 which can be peeled off. The adhesive tape 210 is supported by a support (not illustrated). The ceramic capacitor 101 is temporarily fixed to the adhesive surface of the adhesive tape 210.

Subsequently, a photosensitive epoxy resin is laminated on the core main surface 12 and the capacitor main surface 102, and thus-laminated resin is exposed and developed to thereby form the lowermost resin insulating layer 33. Then, the gap between the inner surface of the accommodation hole 90 and the side surface of the ceramic capacitor 101 is filled with the resin filler 33*a* which constitutes the lowermost resin insulating layer 33 (refer to FIG. 13). Thereafter, by heating the resultant structure, the lowermost resin insulating layer 33 and the resin filler 33*a* are hardened and the ceramic capacitor 101 is fixed into the core board. At this time, the adhesive tape 210 is peeled off.

Figure 14:
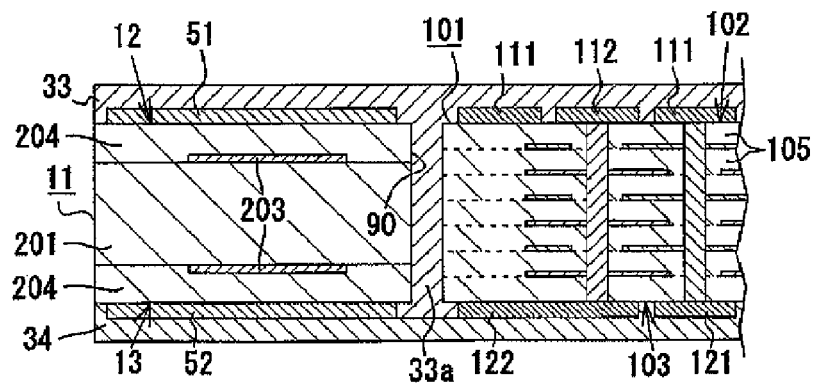
FIG. 14 is an explanatory view of a manufacturing method of a wiring board according to a first embodiment.
Figure 15:
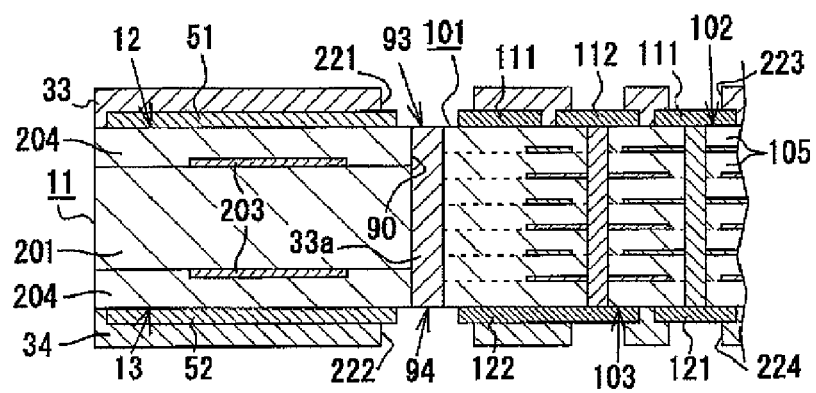
FIG. 15 is an explanatory view of a manufacturing method of a wiring board according to a first embodiment.

Next, a photosensitive epoxy resin is laminated on the core rear surface 13 and the capacitor rear surface 103, and thus-laminated resin is exposed and developed to thereby form the uppermost resin insulating layer 34 (refer to FIG. 14). In a subsequent opening formation step, the lowermost resin insulating layer 33 is subjected to a laser punching process using an YAG laser or a carbon dioxide laser so as to form a main surface side opening portion 221 in a predetermined position where an obverse surface side connecting pattern 61 is to be formed (refer to FIG. 15). Also, the uppermost resin insulating layer 34 is subjected to the laser punching process so as to form a rear surface side opening portion 222 in a predetermined position where a rear surface side connecting pattern 62 is to be formed. More particularly, a portion of the lowermost resin insulating layer 33 located directly above the above-mentioned gap is removed to form the opening portion 221 which exposes a portion of the core board main surface side power supplying pattern 51 and a portion of the obverse surface side power supplying electrode 111. In addition, when the height of the core board main surface side power supplying pattern 51 and that of the obverse surface side power supplying electrode 111 differs, a bottom face of the opening portion 221 is made lower than an obverse surface of the lower one so as to expose both portions of the power supplying pattern 51 and the power supplying electrode 111.

Similarly, a portion of the uppermost resin insulating layer 34 located directly under the gap is removed to form the opening portion 222 which exposes a portion of the core board rear surface side grounding pattern 52 and a portion of the rear surface side grounding electrode 122. In addition, when the height of the core board rear surface side grounding pattern 52 and the rear surface side grounding electrode 122 differs, a bottom face of the opening portion 222 is made higher than the reverse surface of the higher one so as to expose both portions of the grounding pattern 52 and the grounding electrode 122. A via hole 223 which exposes the obverse surface side power supplying electrode 111 and the obverse surface side grounding electrode 112, respectively, is formed on a position where the via conductor 47 is to be formed in the lowermost resin insulating layer 33. Further, a via hole 224 which exposes the rear surface side power supplying electrode 121 and the rear surface side grounding electrode 122, respectively, is formed on a position where the via conductor 47 is to be formed in the uppermost resin insulating layer 34.

Figure 16:
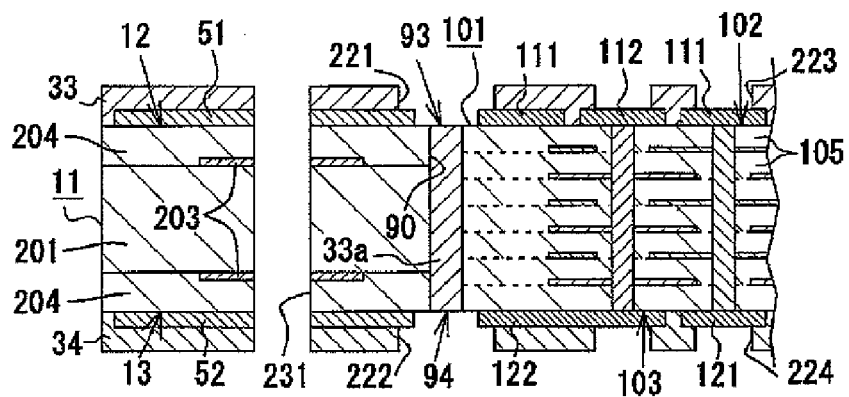
FIG. 16 is an explanatory view of a manufacturing method of a wiring board according to a first embodiment.
Figure 17:
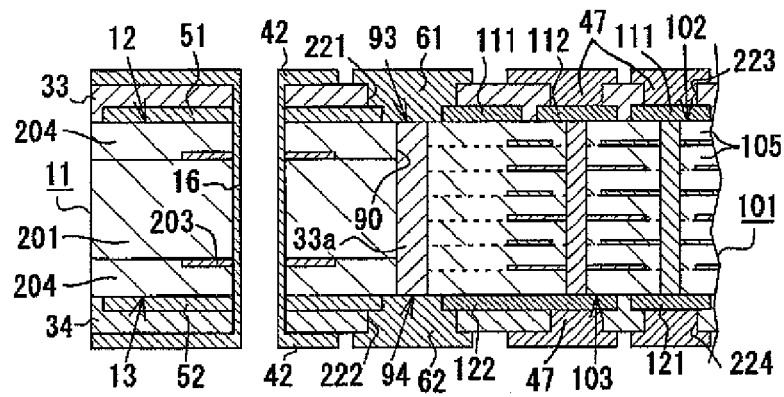
FIG. 17 is an explanatory view of a manufacturing method of a wiring board according to a first embodiment.

Furthermore, a through-hole 231 which penetrates the core board 11 and the resin insulating layers 33, 34 is formed in the predetermined location in a punching process using a drill machine (refer to FIG. 16). Then, a main surface side connecting conductor formation step and a rear surface side connecting conductor formation step are carried out (refer to FIG. 17). More particularly, after applying an electroless plating to the lowermost resin insulating layer 33, the uppermost resin insulating layer 34, the inner faces of the opening portions 221, 222 and an inner face of the through-hole 231, an etching resist is formed, and subsequently an electrolytic copper plating is applied. Further, the thus-applied etching resist is removed and a soft etching is applied. As a result, the obverse surface side connecting pattern 61 is formed in the main surface side opening portion 221, and the rear surface side connecting pattern 62 is formed in the rear surface side opening portion 222. Also, the conductor layers 42 are pattern printed on the lowermost resin insulating layer 33 and the uppermost resin insulating layer 34, respectively. In the same time, the through-hole conductor 16 is formed in the through-hole 231, while the via conductor 47 is formed inside the via holes 223, 224, respectively. Consequently, the core board main surface side power supplying pattern 51 and the obverse surface side power supplying electrode 111 are connected through the obverse surface side connecting pattern 61, and the core board rear surface side grounding pattern 52 and the rear surface side grounding electrode 122 are connected through the rear surface side connecting pattern 62.

Figure 18:
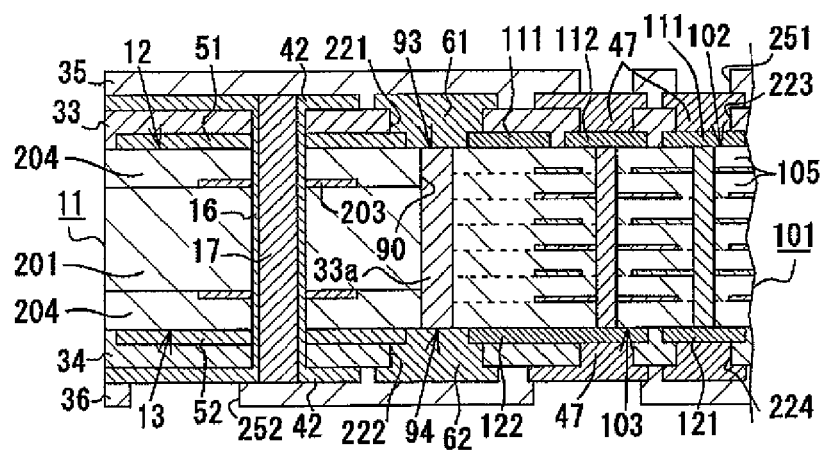
FIG. 18 is an explanatory view of a manufacturing method of a wiring board according to a first embodiment.

A filling step is carried out after the main surface side connecting conductor formation step and the rear surface side connecting conductor formation step. More particularly, a hollow portion of the through-hole conductor 16 is filled with an insulating resin material (epoxy resin) to thereby form the filler 17 (refer to FIG. 18).

Thereafter, a step of forming a buildup layer is performed. In the step of forming a buildup layer, the first buildup layer 31 is formed on the lowermost resin insulating layer 33, and the second buildup layer 32 is formed on the uppermost resin insulating layer 34, by the use of a known method. Specifically, by bonding a photosensitive epoxy resin to the resin insulating layers 33, 34 and performing an exposing and developing process thereto, the resin insulating layers 35, 36 having blind holes 251, 252 at positions at which the via conductors 43 should be formed are formed (refer to FIG. 18). The via conductors 43 are formed inside the blind holes 251, 252 by performing the electroless copper plating process in a known method. Further, the terminal pads 44 are formed on the resin insulating layer 35, and the BGA pads 48 are formed on the resin insulating layer 36.

A photosensitive epoxy resin is applied onto the resin insulating layers 35, 36 and then is hardened, thereby forming solder resists 37, 38. An exposing and developing process is performed in a state in which a predetermined mask is disposed, thereby patterning openings 40, 46 in the solder resists 37, 38. The solder bumps 45 are formed on the terminal pads 44 and the solder bumps 49 are formed on the BGA pads 48. As a result, the wiring board 10 including the core board 11 and the buildup layers 31, 32 is completed.

Therefore, according to the embodiment, the following advantages can be obtained.

(1) According to the method for manufacturing the wiring board 10 of this embodiment, since the obverse surface side connecting pattern 61 is formed in the main surface side opening portion 221 formed in the lowermost resin insulating layer 33, the obverse surface side connecting pattern 61 can be formed simultaneously with the formation of the via conductor 47 in the lowermost resin insulating layer 33. Similarly, since the rear surface side connecting pattern 62 is formed in the rear surface side opening portion 222 formed in the uppermost resin insulating layer 34, the rear surface side connecting pattern 62 can be formed simultaneously with the formation of the via conductor 47 in the uppermost resin insulating layer 34. Thus, a step of forming a plating layer, a step of forming an etching resist on the plating layer and a step of etching the plating layer so as to be used as the obverse surface side connecting pattern 61 and the rear surface side connecting pattern 62, and a step of removing the etching resist or the like can be simplified. As a result, the wiring board 10 can be easily manufactured and the manufacturing cost thereof can be reduced.

Further, since the ceramic capacitor 101 is fixed simultaneously with the formation of the lowermost resin insulating layer 33, a manufacturing step can be further simplified. Furthermore, since the material which fills the gap between the inner face of the accommodation hole 90 and the side face of the ceramic capacitor 101 is the resin filler 33a which constitutes a part of the lowermost resin insulating layer 33, no other material fixing the ceramic capacitor 101 to the core board 11 is necessary. Thus, the number of materials required for manufacturing the wiring board 10 decreases whereby the wiring board 10 can be produced at low cost.

(2) It is possible that the obverse surface side connecting pattern 61 and the rear surface side connecting pattern 62 may be formed after fixing the ceramic capacitor 101 to the core board 11 and before a formation of the lowermost resin insulating layer 33 and the uppermost resin insulating layer 34. In this case, the obverse surface side connecting pattern 61 and the rear surface side connecting pattern 62 are formed through the plating layer formation step, the resist formation step, the etching step and the etching resist removing step. However, the ceramic capacitor 101 has an uneven surface due to the electrodes 111, 112, 121, 122 formed thereon, and also the sintered ceramic body 104 may include a camber therein. Therefore, it is difficult to form the obverse surface side connecting pattern 61 and the rear surface side connecting pattern 62 by forming the plating layer and the etching step.

On the other hand, in this embodiment, the opening portions 221, 222 are formed after forming the lowermost resin insulating layer 33 and the uppermost resin insulating layer 34, and then the obverse surface side connecting pattern 61 and the rear surface side connecting pattern 62 are formed. Thus, the obverse surface side connecting pattern 61 or the rear surface side connecting pattern 62 can be formed without being influenced by the unevenness of the ceramic capacitor 101 or the camber of the sintered ceramic body 104.

(3) when the obverse surface side connecting pattern 61 and the rear surface side connecting pattern 62 are formed after fixing the ceramic capacitor 101 and before forming the resin insulating layers 33, 34, the obverse surface side connecting pattern 61 and the rear surface side connecting pattern 62 may be damaged by the heat stress generated at the time of forming the resin insulating layers 33, 34. However, in this embodiment, since the obverse surface side connecting pattern 61 and the rear surface side connecting pattern 62 is formed after forming the resin insulating layers 33, 34, the damage to the obverse surface side connecting pattern 61 and the rear surface side connecting pattern 62 due to the heat stress or the like can be prevented. Thus, the connection reliability of the obverse surface side connecting pattern 61 and the rear surface side connecting pattern 62 improves.

(4) Conventionally, a wiring board having a plurality of capacitors accommodated in the accommodation holes in the lateral direction and a plurality of connecting conductors which connects a part of the electrodes in the capacitor and conductor patterns disposed on a core main surface has been disclosed. However, there is a problem that the connecting conductor is only connectable to an electrode disposed on an outer circumference portion of the capacitor, and the electrical power cannot be supplied to a capacitor disposed on the central portion of the accommodation hole.

On the other hand, the wiring board 10 manufactured by the method according to this embodiment, one piece of ceramic capacitor 101 is accommodated in the accommodation hole 90, and the core board main surface side power supplying pattern 51 and the obverse surface side power supplying electrode 111 are connected through the obverse surface side connecting pattern 61. Because the obverse surface side power supplying electrode 111 is a plane-shaped conductor which covers almost the entire capacitor main surface 102, the electrical power can be supplied to the central part of the ceramic capacitor 101 (central portion of the accommodation hole 90) from the core board 11 side. Further, since the obverse surface side connecting pattern 61 connects between the core board main surface side power supplying pattern 51 and the obverse surface side power supplying electrode 111, the electrical pathway (first power supply pathway) to the IC chip 21 is formed through the core board main surface side power supplying pattern 51, the obverse surface side connecting pattern 61, the obverse surface side power supplying electrode 111 and the first wiring laminated body. As a result, the number of the electrical pathways connected to the IC chip 21 increases, thereby lowering the resistance in the wiring board 10 and reducing a voltage drop. Therefore, the electrical power can be reliably supplied to the IC chip 21, and the IC chip 21 can fully operate without any malfunction. Thus, the wiring board 10 with an excellent electrical property, reliability or the like can be produced.

(5) The obverse surface side connecting pattern 61 according to this embodiment has a three-dimensional shape with a certain thickness because it is formed in the opening portion 221. As a result, the resistance of the obverse surface side connecting pattern 61 becomes small, and the voltage drop at the time of a current supply is also reduced. Thus, a large electrical current can be fed through the obverse surface side connecting pattern 61, thereby being able to supply the sufficient electrical current to the IC chip 21.

Second Embodiment

Hereinafter, a wiring board according to a second embodiment of the invention will be described in detail with reference to the drawings.

Figure 19:
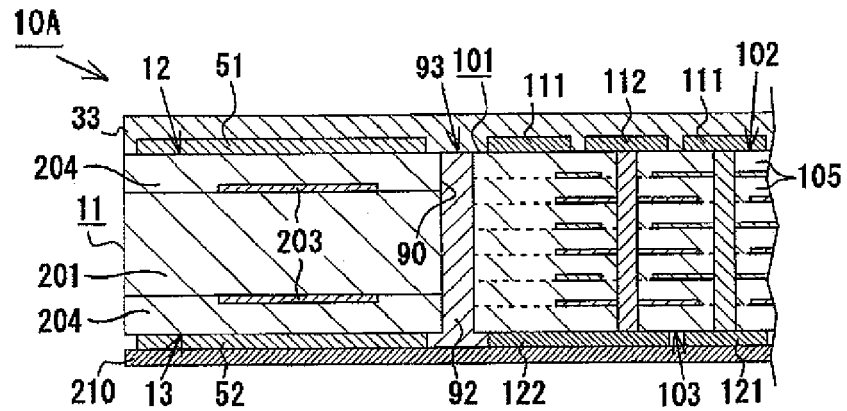
FIG. 19 is an explanatory view of a manufacturing method of a wiring board according to a second embodiment.
Figure 20:
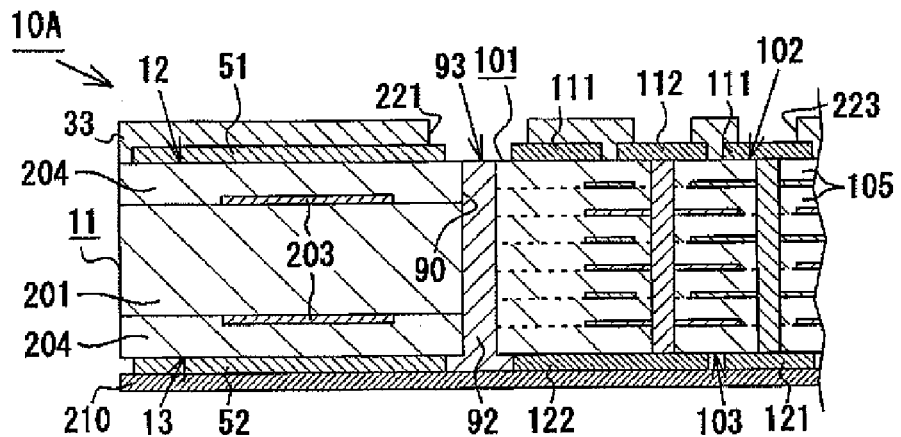
FIG. 20 is an explanatory view of a manufacturing method of a wiring board according to a second embodiment.

As shown in FIGS. 19 and 20, a wiring board 10A according to the second embodiment uses a resin filler 92 different from that in the first embodiment where the resin filler 33a which constitutes a part of the lowermost resin insulating layer 33 is used for filling the gap between the inner face of the accommodation hole 90 and the side face of the ceramic capacitor 101. The resin filler 92 is made of polymer material (thermosetting resin, such epoxy, in this embodiment). Therefore, the method for manufacturing the wiring board 10A according to this embodiment also differs from that of the wiring board 10 according to the first embodiment.

In this embodiment, when the ceramic capacitor 101 is temporarily fixed in the accommodating hole 90, the fixing step is conducted, instead of forming the lowermost resin insulating layer 33 on the core main surface 12 of the core board 11 and the capacitor main surface 102 of the ceramic capacitor 101. More particularly, the gap between the inner surface of the accommodation hole 90 and the side surface of the ceramic capacitor 101 is filled with the resin filler 92 made of thermosetting resin (an under-filling material made by Namics Corporation) by the use of a dispenser machine (made by Asymtek company) (refer to FIG. 19). At this time, the resin filler 92 is filled so that the main surface side wiring forming portion 93 is at the same level as the core main surface 12 and the capacitor main surface 102. Thereafter, by heating the resultant structure, the resin filler 92 is hardened and the ceramic capacitor 101 is fixed in the accommodation hole 90.

Next, an insulating layer formation step is conducted by way of forming the lowermost resin insulating layer 33 on the core main surface 12, the capacitor main surface 102 and the resin filler 92 (refer to FIG. 19). Furthermore, an opening portion formation step is conducted. More particularly, the main surface side opening portion 221 and the via hole 223 is formed in the lowermost resin insulating layer 33 by the laser punching process (refer to FIG. 20). At this time, the adhesive tape 210 is peeled off, and the uppermost resin insulating layer 34 is formed on the core rear surface 13 of the core board 11 and the capacitor rear surface 103 of the ceramic capacitor 101.

Therefore, in this embodiment, since the obverse surface side connecting pattern 61 is formed simultaneously with the formation of the via conductor 47 in the lowermost resin insulating layer 33, the manufacturing step of the wiring board 10A can be simplified, thereby achieving an easy production of the wiring board 10A and a cost reduction in manufacturing the wiring board 10. Further, the resin filler 92 is a separate material from the material of the lowermost resin insulating layer 33, the resin filler 92 can be made of the most suitable material for fixing the ceramic capacitor 101. As a result, the ceramic capacitor 101 is firmly fixed whereby the connection reliability of the obverse surface side connecting pattern 61 formed on resin filler 92 improves.

Furthermore, in the opening portion formation step, the main surface side opening portion 221 is formed in the lowermost resin insulating layer 33 by the laser punching process. In addition, since the resin filler 92 disposed at the lower side of the lowermost resin insulating layer 33 has already been hardened prior to the opening portion formation step, the resin filler 92 is harder than the lowermost resin insulating layer 33. Thus, a laser output can be easily adjusted to such an extent that it only processes the lowermost resin insulating layer 33, but does not process the resin filler 92. As a result, the depth of the main surface side opening portion 221 can be easily controlled.

On the other hand, the embodiments of the invention may be modified as follows.

Figure 21:
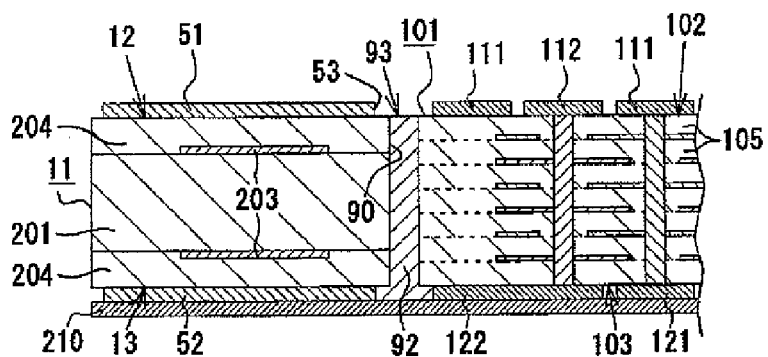
FIG. 21 is an explanatory view of a manufacturing method of a wiring board according to another embodiment.
Figure 22:
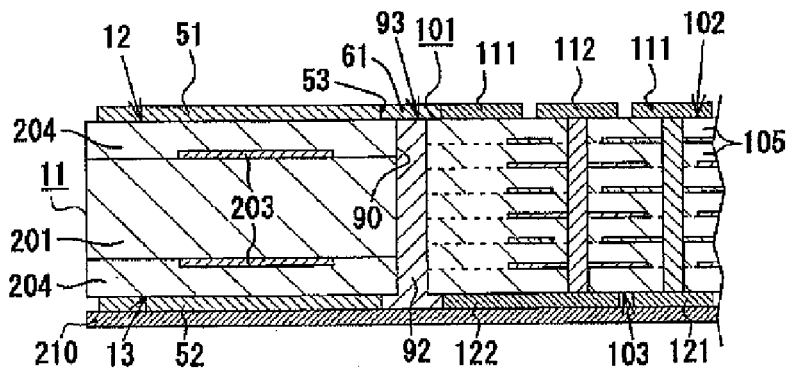
FIG. 22 is an explanatory view of a manufacturing method of a wiring board according to another embodiment.

In the second embodiment, after filling with the resin filler 92 and forming the lowermost resin insulating layer 33, the main surface side opening portion 221 is formed in the lowermost resin insulating layer 33 to form the obverse surface side connecting pattern 61. However, the obverse surface side connecting pattern 61 (refer to FIG. 22) may be formed on the main surface side wiring forming portion 93 (between the core board main surface side power supplying pattern 51 and the obverse surface side power supplying electrode 111) after filling with the resin filler 92 (refer to FIG. 21), and then the lowermost resin insulating layer 33 may be formed thereon. In this case, the obverse surface side connecting pattern 61 assumes a plate-like shape and has the same thickness as that of the core board main surface side power supplying pattern 51 and that of the obverse surface side power supplying electrode 111. Thus, one end of the obverse surface side connecting pattern 61 only joins the side face 53 of the core board main surface side power supplying pattern 51, and the other end thereof only joins a side face of the obverse surface side power supplying electrode 111.

Figure 23:
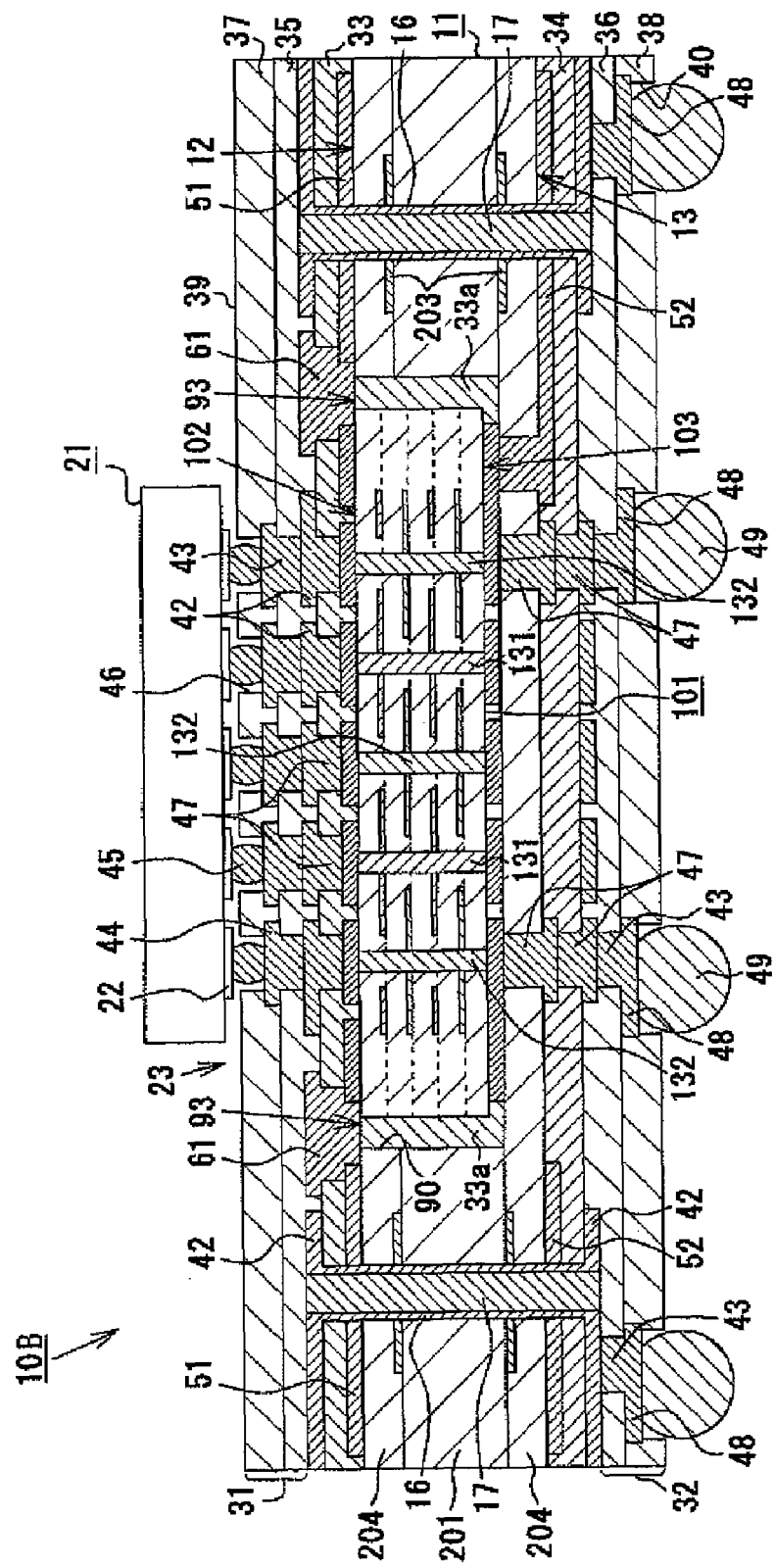
FIG. 23 is a schematic sectional view showing a wiring board according to another embodiment.

Although the accommodation hole 90 according to the above-mentioned embodiments was a through-hole which opens at both of the core main surface 12 and the core rear surface 13 of the core board 11, as a wiring board 10B according to another embodiment shown in FIG. 23, the accommodation hole 90 may be a non-through-hole which opens only at the core main surface 12.

Figure 24:
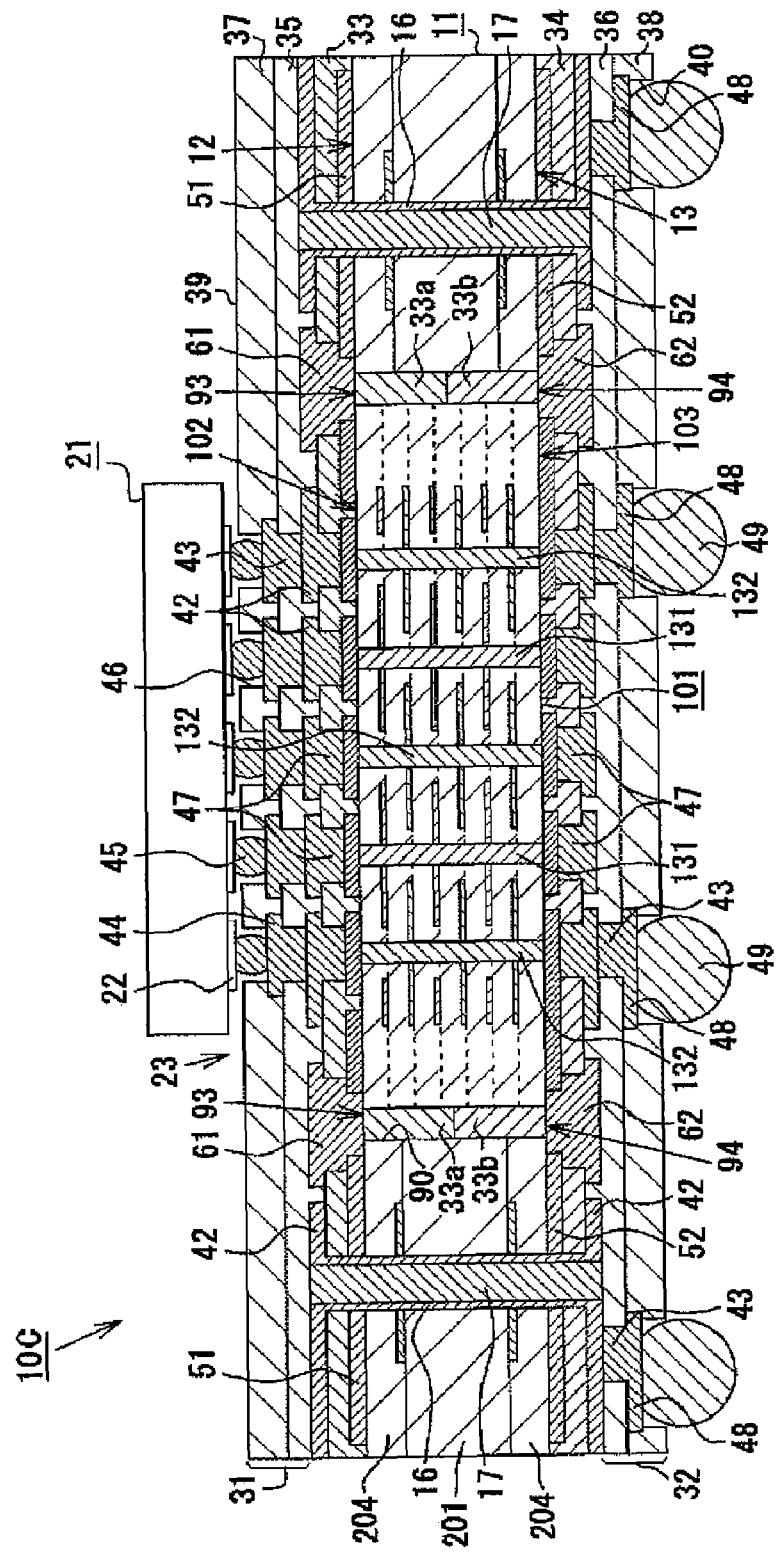
FIG. 24 is a schematic sectional view showing a wiring board according to another embodiment.

In the first embodiment, the gap between the inner face of the accommodation hole 90 and the side face of the ceramic capacitor 101 was filled with only the resin filler 33a which constitutes a part of the lowermost resin insulating layer 33. However, as a wiring board 10C according to another embodiment shown in FIG. 24, the gap may be filled with the resin filler 33a which constitutes a part of the lowermost resin insulating layer 33 and a resin filler 33b which constitutes a part of the uppermost resin insulating layer 34.

Figure 25:
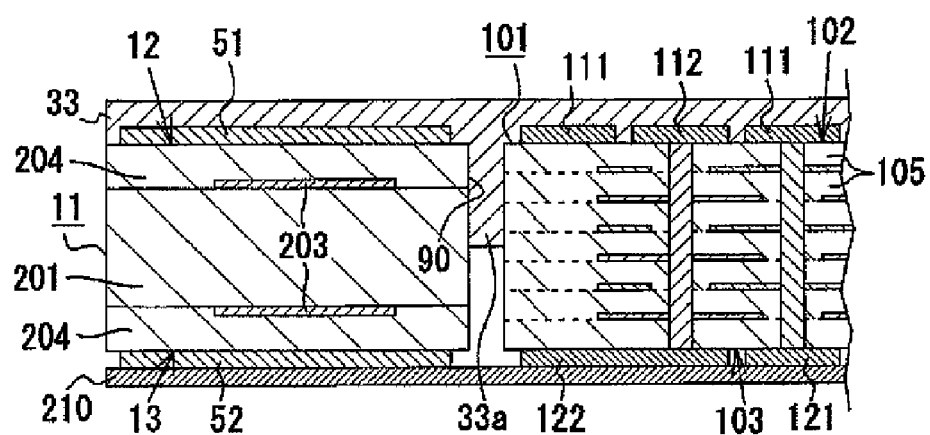
FIG. 25 is an explanatory view of a manufacturing method of a wiring board according to another embodiment.
Figure 26:
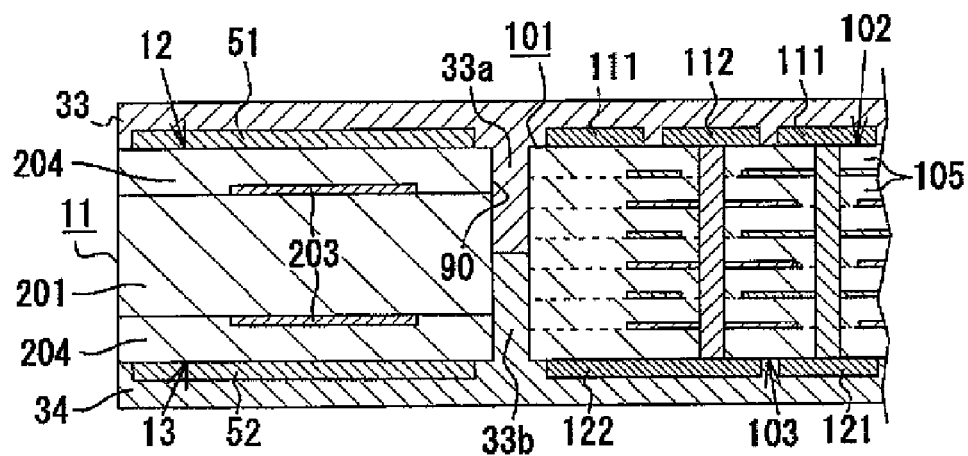
FIG. 26 is an explanatory view of a manufacturing method of a wiring board according to another embodiment.

In this case, while temporarily fixing the ceramic capacitor 101, the lowermost resin insulating layer 33 is formed on the core main surface 12 of the core board 11 and the capacitor main surface 102 of the ceramic capacitor 101. Subsequently, the upper half of the gap between the inner face of the accommodation hole 90 and the side face of the ceramic capacitor 101 is filled with the resin filler 33a (refer to FIG. 25). Then, the adhesive tape 210 is peeled off at this time. Next, while forming the uppermost resin insulating layer 34 on the core rear surface 13 of the core board 11 and the capacitor rear surface 103 of the ceramic capacitor 101, the lower half of the gap is filled with the resin filler 33b (refer to FIG. 26). In this way, the resin can easily and completely spread in the accommodation hole 90 whereby the ceramic capacitor 101 is reliably fixed to the core board 11. Further, when the accommodation hole 90 is filled with only the resin filler 33a, it is necessary to thickly form the lowermost resin insulating layer 33. However, when the accommodation hole 90 is filled with a combination of the resin filler 33a and the resin filler 33b, it is not necessary to thickly form the lowermost resin insulating layer 33.

In the above-mentioned embodiments, when forming the opening portions 221, 222 in the positions in which the obverse surface side connecting pattern 61 and the rear surface side connecting pattern 62 are to be formed, respectively, the portions of the resin insulating layers 33, 34 corresponding to the positions directly above/directly under the gap between the inner face of the accommodation hole 90 and the side face of the ceramic capacitor 101 were removed on the whole. However, when forming the opening portions 221, 222, the portions of the resin insulating layers 33, 34 corresponding to the positions directly above/directly under the gap may be partially removed. That is, when the portions corresponding to the positions directly above/directly under the gap are partially removed, the obverse surface side connecting pattern 61 and the rear surface side connecting pattern 62 can be formed.

Figure 27:
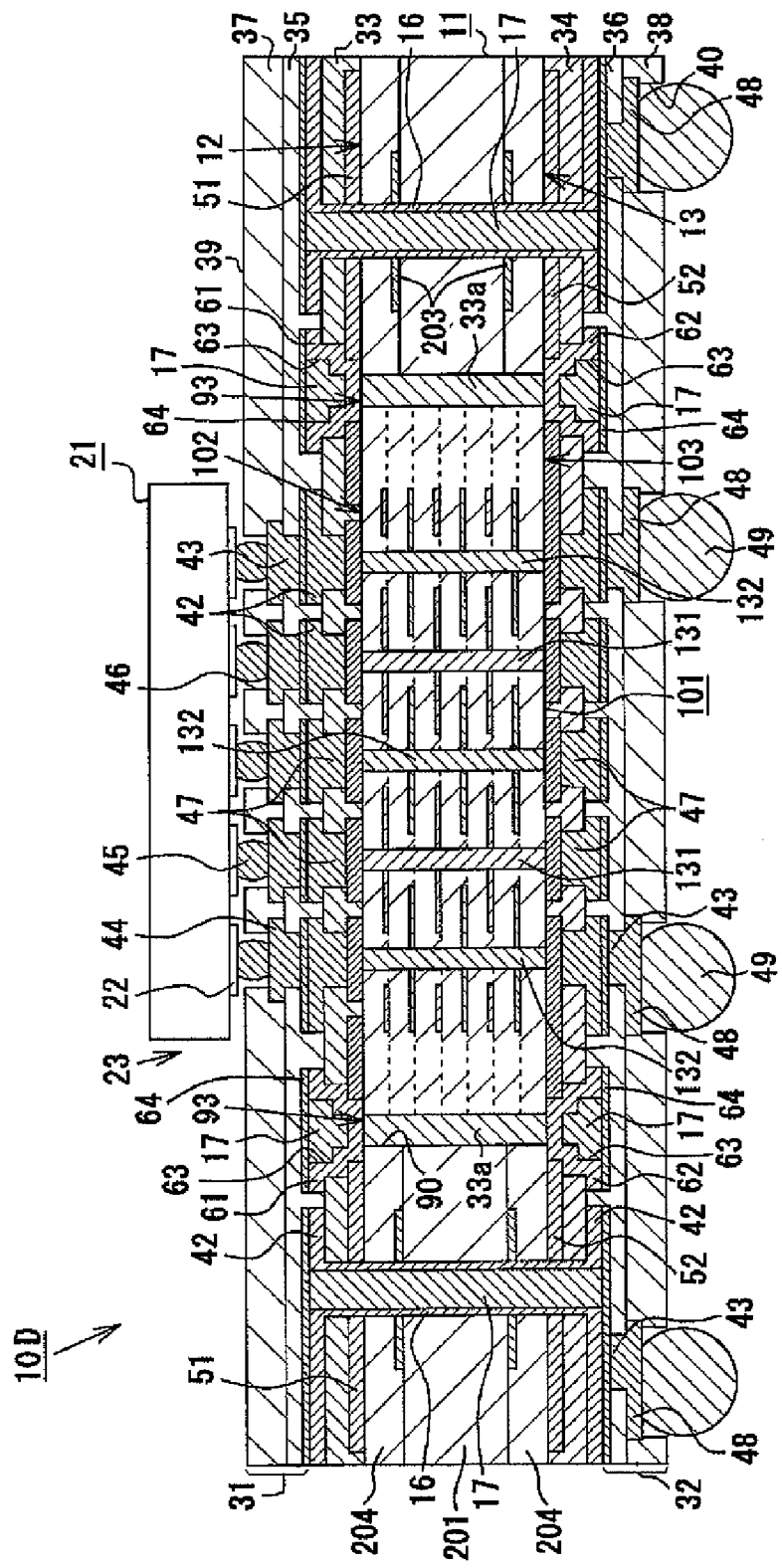
FIG. 27 is a schematic sectional view showing a wiring board according to another embodiment.

In the filling step according to the above-mentioned embodiments, the hollow portions of the plurality of through-hole conductors 16 were filled with the insulating resin material. The obverse surface side connecting pattern 61 and the rear surface side connecting pattern 62 according to the above-mentioned embodiments were made flat at the obverse (or reverse) surface. However, as a wiring board 10D shown in FIG. 27, the obverse surface side connecting pattern 61 and the rear surface side connecting pattern 62 may be a conductor having a concave portion 63. Further, in the filling step, each concave portion 63 is filled with the same insulating material as the insulating resin material (the filler 17) which fills the hollow portion of the through-hole conductor 16, along with filling the hollow portion of the through-hole conductor 16. Then, the obverse surface of the concave portion may be made flat. With this structure, the conductor layer 64 may be formed on the obverse surface side connecting pattern 61 and the rear surface side connecting pattern 62, thereby improving the degree of freedom of the wiring design in the wiring laminated body. Furthermore, the manufacturing cost of the wiring board 10D can be reduced because the manufacturing step is simplified compared to the case where the filling steps of the hollow portion of the conductor and the concave portion 63 are conducted individually.

Instead of manufacturing the wiring board according to the method of the above-mentioned embodiments, for example, a wiring board 10E may be manufactured by the following method.

Figure 13:
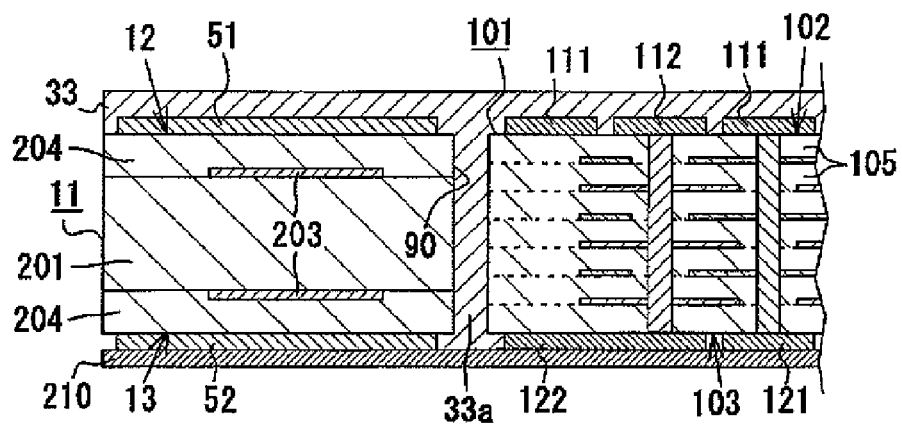
FIG. 13 is an explanatory view of a manufacturing method of a wiring board according to a first embodiment.

First, the wiring board 10E is manufactured at the stage of FIG. 13 through conducting the insulating layer formation and the fixing step according to the manufacturing method of the above-mentioned embodiment. Subsequently, the adhesive tape 210 is peeled off from the ceramic capacitor 101. The core board rear surface side grounding pattern 52 and the grounding electrode 122 have the same height and do not have any unevenness—i.e., they are level (refer to FIG. 28). It is noted that the core rear surface 13 of the core board 11 and the capacitor rear surface 103 of the ceramic capacitor 101 are also level.

Without forming the uppermost resin insulating layer 34 on the core rear surface 13 and the capacitor rear surface 103, a through-hole 231 which penetrates the core board 11 and the resin insulating layer 33 is formed in a predetermined location using a drill machine. Then, a main surface side connecting conductor formation step and a rear surface side connecting conductor formation step are conducted. More particularly, after applying an electroless plating to the lowermost resin insulating layer 33, an etching resist is formed thereon, and subsequently an electrolytic copper plating is applied. Further, the thus-applied etching resist is removed and a soft etching is applied so as to remove unnecessary electroless copper plating. As a result, the obverse surface side connecting pattern 61 is formed in the obverse surface side opening portion 221, while the conductor layer 42 is pattern printed on the lowermost resin insulating layer 33. Furthermore, the rear surface side connecting pattern 62 which connects the core board rear surface side grounding pattern 52 and the grounding electrode 122 is formed on the core rear surface 13. At the same time, the through-hole conductor 16 is formed in the through-hole 231, while the via conductor 47 is formed inside the via hole 223 (refer to FIG. 29).

Then, after the main surface side connecting conductor formation step and the rear surface side connecting conductor formation step, the filling step is conducted. Subsequently, a buildup layer formation step is conducted to complete the wiring board 10E.

Figure 28:
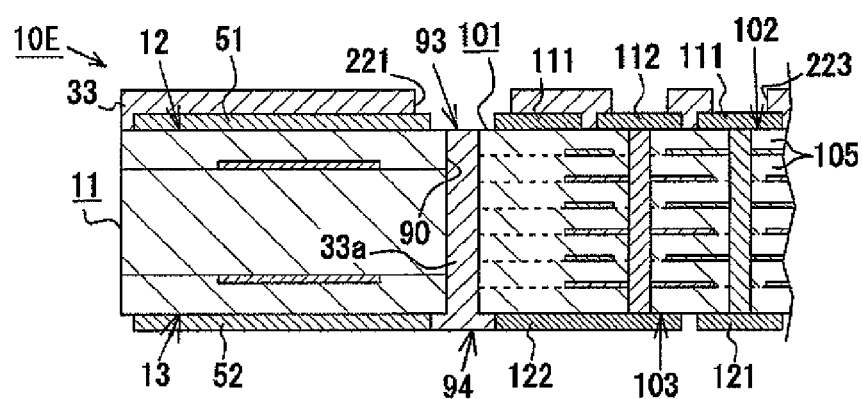
FIG. 28 is an explanatory view of a manufacturing method of a wiring board according to another embodiment.
Figure 29:
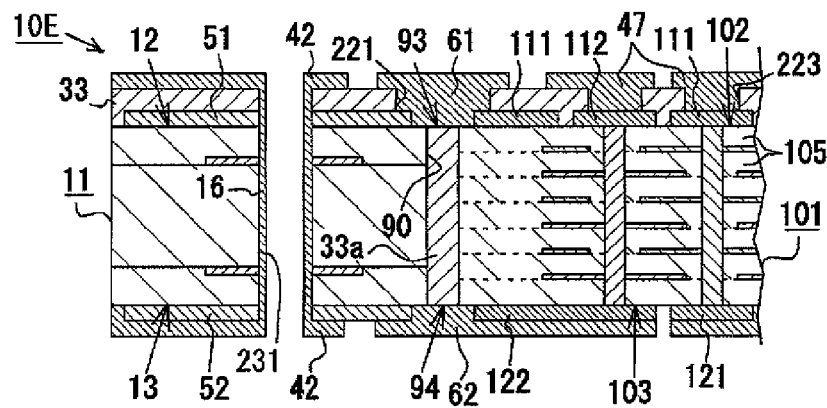
FIG. 29 is an explanatory view of a manufacturing method of a wiring board according to another embodiment.

The thus-manufactured wiring board 10E preferably uses a reverse side as a chip mounting face side as shown in FIGS. 28 and 29. In this case, a surface of the buildup layer can secure the high standard of the flatness. Thus, coplanarity of the surface of the terminal pad 44, which is exposed at the chip mounting face, becomes high, thereby improving the connection reliability of the IC chip 21. According to this method, since the formation of the uppermost resin insulating layer 34 on the core rear surface 13, the formation of the rear surface side opening portion 222 and the formation of the via hole 224 can be omitted, the number of manufacturing steps can be reduced as compared to the case of the above-mentioned embodiment. Further, according to this method, the wider reverse side connecting pattern 62 can be relatively easily formed.

Other modifications and alterations will occur to others upon their reading and understanding of the specification. It is intended that all such modifications and alterations be included insofar as they come within the scope of the invention as claimed or the equivalents thereof.

Having described the invention, the following is claimed:

1. A method for manufacturing a wiring board, comprising:
   a preparation step of preparing a core board including a core main surface, a core rear surface, an accommodation hole opening at least at the core main surface side and a core board main surface side conductor disposed on the core main surface, and preparing an electronic component including a component main surface, a component rear surface and a component main surface side electrode disposed on the component main surface;
   a fixing step of fixing the electronic component to the core board by filling a gap between the electronic component and the core board with a resin filler;
   an insulating layer formation step of forming a lowermost resin insulating layer, which serves as a lowermost layer of a wiring laminated body, on the core main surface, the component main surface and the resin filler after the fixing step;
   an opening portion formation step of forming an opening portion exposing a part of the core board main surface side conductor and the component main surface side electrode by removing at least a portion of the lowermost resin insulating layer located directly above the gap; and
   a main surface side connecting conductor formation step of forming a main surface side connecting conductor in the opening portion and connecting the core board main surface side conductor to the component main surface side electrode.

2. A method for manufacturing a wiring board, comprising:
   a preparation step of preparing a core board including a core main surface, a core rear surface, an accommodation hole opening at least at the core main surface side and a core board main surface side conductor disposed on the core main surface, and preparing an electronic component including a component main surface, a component rear surface and a component main surface side electrode disposed on the component main surface;

an insulating layer formation and fixing step of forming a lowermost resin insulating layer, which serves as a lowermost layer of a wiring laminated body, on the core main surface and the component main surface after accommodating the electronic component in the accommodation hole and fixing the electronic component to the core board by filling a gap between the electronic component and the core board with a portion of the lowermost resin insulating layer;

an opening portion formation step of forming an opening portion exposing a part of the core board main surface side conductor and the component main surface side electrode by removing at least a portion of the lowermost resin insulating layer located directly above the gap; and a main surface side connecting conductor formation step of forming a main surface side connecting conductor in the opening portion and connecting the core board main surface side conductor to the component main surface side electrode.

3. The method for manufacturing a wiring board according to claim 1,
wherein the electronic component is a capacitor including a plurality of via conductors formed so as to penetrate the component main surface and the component rear surface, a plurality of inner electrode layers connected to the plurality of via conductors and laminated with a dielectric layer interposed therebetween and the component main surface side electrode connected to an end portion of the plurality of via conductors at the component main surface side.

4. The method for manufacturing a wiring board according to claim 1,
wherein, in the opening portion formation step, a via hole exposing the component main surface side electrode is formed by a laser processing to the lowermost resin insulating layer while forming the opening portion.

5. The method for manufacturing a wiring board according to claim 1,
wherein, in the main surface side connecting conductor formation step, the main surface side connecting conductor is formed by an electroless plating.

6. The method for manufacturing a wiring board according to claim 1,
wherein, in the main surface side connecting conductor formation step, the main surface side connecting conductor is formed in the opening portion by way of forming an etching resist on the lowermost resin insulating layer and an inner face of the opening portion after applying an electroless plating thereto, subsequently applying an electrolytic plating thereto, and applying a soft etching after removing the thus-applied etching resist, while the conductor layer constituting the wiring laminated body is pattern printed on the lowermost resin insulating layer.

7. The method for manufacturing a wiring board according to claim 1,
wherein, after the main surface side connecting conductor formation step, a filling step is conducted by way of filling a hollow portion of the plurality of through-hole conductors formed so as to penetrate the core board and the lowermost resin insulating layer with an insulating resin material, while filling a concave portion generated in the main surface side connecting conductor.

8. The method for manufacturing a wiring board according to claim 2,
wherein the electronic component is a capacitor including a plurality of via conductors formed so as to penetrate the component main surface and the component rear surface, a plurality of inner electrode layers connected to the plurality of via conductors and laminated with a dielectric layer interposed therebetween and the component main surface side electrode connected to an end portion of the plurality of via conductors at the component main surface side.

9. The method for manufacturing a wiring board according to claim 2,
wherein, in the opening portion formation step, a via hole exposing the component main surface side electrode is formed by a laser processing to the lowermost resin insulating layer while forming the opening portion.

10. The method for manufacturing a wiring board according to claim 2,
wherein, in the main surface side connecting conductor formation step, the main surface side connecting conductor is formed by an electroless plating.

11. The method for manufacturing a wiring board according to claim 2,
wherein, in the main surface side connecting conductor formation step, the main surface side connecting conductor is formed in the opening portion by way of forming an etching resist on the lowermost resin insulating layer and an inner face of the opening portion after applying an electroless plating thereto, subsequently applying an electrolytic plating thereto, and applying a soft etching after removing the thus-applied etching resist, while the conductor layer constituting the wiring laminated body is pattern printed on the lowermost resin insulating layer.

12. The method for manufacturing a wiring board according to claim 2,
wherein, after the main surface side connecting conductor formation step, a filling step is conducted by way of filling a hollow portion of the plurality of through-hole conductors formed so as to penetrate the core board and the lowermost resin insulating layer with an insulating resin material, while filling a concave portion generated in the main surface side connecting conductor.

* * * * *